United States Patent
Bobok et al.

(10) Patent No.: US 8,160,857 B2
(45) Date of Patent: Apr. 17, 2012

(54) SELECTIVE COMPILATION OF A SIMULATION MODEL IN VIEW OF UNAVAILABLE HIGHER LEVEL SIGNALS

(75) Inventors: Gabor Bobok, Niskayuna, NY (US); Wolfgang Roesner, Austin, TX (US); Derek E. Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 684 days.

(21) Appl. No.: 12/336,019

(22) Filed: Dec. 16, 2008

(65) Prior Publication Data

US 2010/0153083 A1  Jun. 17, 2010

(51) Int. Cl.
G06F 9/455 (2006.01)
(52) U.S. Cl. ............... 703/14; 703/13; 703/15
(58) Field of Classification Search ......... 703/22, 703/13–17; 717/124; 707/5
See application file for complete search history.

(56) References Cited

U.S. PATENT DOCUMENTS

| | | | |
|---|---|---|---|
| 5,212,650 A | 5/1993 | Hooper et al. |
| 5,369,763 A | 11/1994 | Biles |
| 5,604,895 A | 2/1997 | Raimi et al. |
| 6,117,181 A | 9/2000 | Dearth et al. |
| 6,195,627 B1 | 2/2001 | Bargh et al. |
| 6,202,042 B1 | 3/2001 | Bargh et al. |
| 6,285,914 B1 | 9/2001 | Bae et al. |
| 6,345,242 B1 | 2/2002 | Dearth et al. |
| 6,393,426 B1 | 5/2002 | Odom et al. |
| 6,519,612 B1 | 2/2003 | Howard et al. |
| 6,546,532 B1 | 4/2003 | Kerzman et al. |
| 6,581,191 B1 | 6/2003 | Schubert et al. |
| 6,618,839 B1 | 9/2003 | Beardslee et al. |
| 6,668,364 B2 | 12/2003 | McElvain et al. |
| 6,687,710 B1 | 2/2004 | Dey |
| 6,720,565 B2 | 4/2004 | Innes et al. |
| 6,751,583 B1 | 6/2004 | Clarke et al. |
| 6,754,763 B2 | 6/2004 | Lin |
| 7,392,169 B2 | 6/2008 | Gabele et al. |
| 2002/0019969 A1 | 2/2002 | Hellestrand et al. |
| 2002/0032559 A1 | 3/2002 | Hellestrand et al. |
| 2002/0049576 A1 | 4/2002 | Meyer et al. |
| 2002/0123874 A1 | 9/2002 | Roesner et al. |
| 2002/0128809 A1 | 9/2002 | Roesner et al. |
| 2002/0129333 A1 | 9/2002 | Chandhoke et al. |
| 2002/0152060 A1 | 10/2002 | Tseng et al. |
| 2003/0005416 A1 | 1/2003 | Henftling et al. |
| 2003/0035375 A1 | 2/2003 | Freeman |
| 2003/0037222 A1 | 2/2003 | Emberson et al. |
| 2003/0101039 A1 | 5/2003 | Gabele et al. |

(Continued)

*Primary Examiner* — Kandasamy Thangavelu
(74) *Attorney, Agent, or Firm* — Yudell Insidore Ng Russell PLLC

(57) ABSTRACT

In response to receiving HDL file(s) that specify a plurality of hierarchically arranged design entities defining a design to be simulated and that specify an instrumentation entity for monitoring simulated operation of the design, an instrumented simulation executable model of the design is built. Building the model includes compiling the HDL file(s) specifying the plurality of hierarchically arranged design entities defining the design and instantiating at least one instance of each of the plurality of hierarchically arranged design entities, and further includes instantiating an instance of the instrumentation entity within an instance of a particular design entity among the plurality of design entities and, based upon a reference in an instrumentation statement in the one or more HDL files, logically attaching an input of the instance of the instrumentation entity to an input source within the design that is outside the scope of the particular design entity.

15 Claims, 26 Drawing Sheets

U.S. PATENT DOCUMENTS

| | | |
|---|---|---|
| 2003/0121011 A1 | 6/2003 | Carter et al. |
| 2003/0144828 A1 | 7/2003 | Lin |
| 2003/0188299 A1 | 10/2003 | Broughton et al. |
| 2003/0192032 A1 | 10/2003 | Andrade et al. |
| 2005/0102125 A1 | 5/2005 | Tseng |
| 2005/0125754 A1 | 6/2005 | Schubert et al. |
| 2005/0137840 A1 | 6/2005 | Peck et al. |
| 2006/0195822 A1* | 8/2006 | Beardslee et al. ............ 717/124 |
| 2007/0061121 A1* | 3/2007 | Bobok et al. .................... 703/13 |
| 2007/0260441 A1* | 11/2007 | Bobok et al. .................... 703/14 |
| 2007/0260443 A1 | 11/2007 | Bobok |
| 2008/0168057 A1* | 7/2008 | Gabele et al. ..................... 707/5 |
| 2008/0183458 A1* | 7/2008 | Bobok et al. .................... 703/17 |
| 2008/0195368 A1* | 8/2008 | Bobok et al. .................... 703/16 |
| 2008/0249758 A1* | 10/2008 | Gabele et al. .................. 703/14 |
| 2008/0281571 A1* | 11/2008 | Roesner et al. ................ 703/15 |
| 2008/0288234 A1* | 11/2008 | Nelson et al. .................. 703/22 |
| 2008/0294413 A1* | 11/2008 | Bobok et al. .................... 703/16 |
| 2009/0112552 A1* | 4/2009 | Behm et al. .................... 703/14 |
| 2009/0112561 A1* | 4/2009 | Behm et al. .................... 703/17 |
| 2009/0192778 A1* | 7/2009 | Gabele et al. .................. 703/17 |

* cited by examiner

```
ENTITY FXUCHK IS
    PORT(   S_IN    :   IN std_ulogic;
            Q_IN    :   IN std_ulogic;
            R_IN    :   IN std_ulogic;
            clock   :   IN std_ulogic;
            fails   :   OUT std_ulogic_vector(0 to 1);
            counts  :   OUT std_ulogic_vector(0 to 2);
            harvests :  OUT std_ulogic_vector(0 to 1);
    );
```
450

452 {
--!! BEGIN
--!! Design Entity: FXU;
}

453 {
--!! Inputs
--!! S_IN    => B.C.S;
--!! Q_IN    => A.Q;
--!! R_IN    => R;
--!! CLOCK   => clock;
--!! End Inputs
}

454 {
--!! Fail Outputs;
--!! 0 : "Fail message for failure event 0";
--!! 1 : "Fail message for failure event 1";
--!! End Fail Outputs;
}
451

455 {
--!! Count Outputs;
--!! 0 : <event0> clock;
--!! 1 : <event1> clock;
--!! 2 : <event2> clock;
--!! End Count Outputs;
}

456 {
--!! Harvest Outputs;
--!! 0 : "Message for harvest event 0";
--!! 1 : "Message for harvest event 1";
--!! End Harvest Outputs;
}

457 { --!! End;

440

```
ARCHITECTURE example of FXUCHK IS

BEGIN

... HDL code for entity body section ...     458

END;
```

Fig. 3C

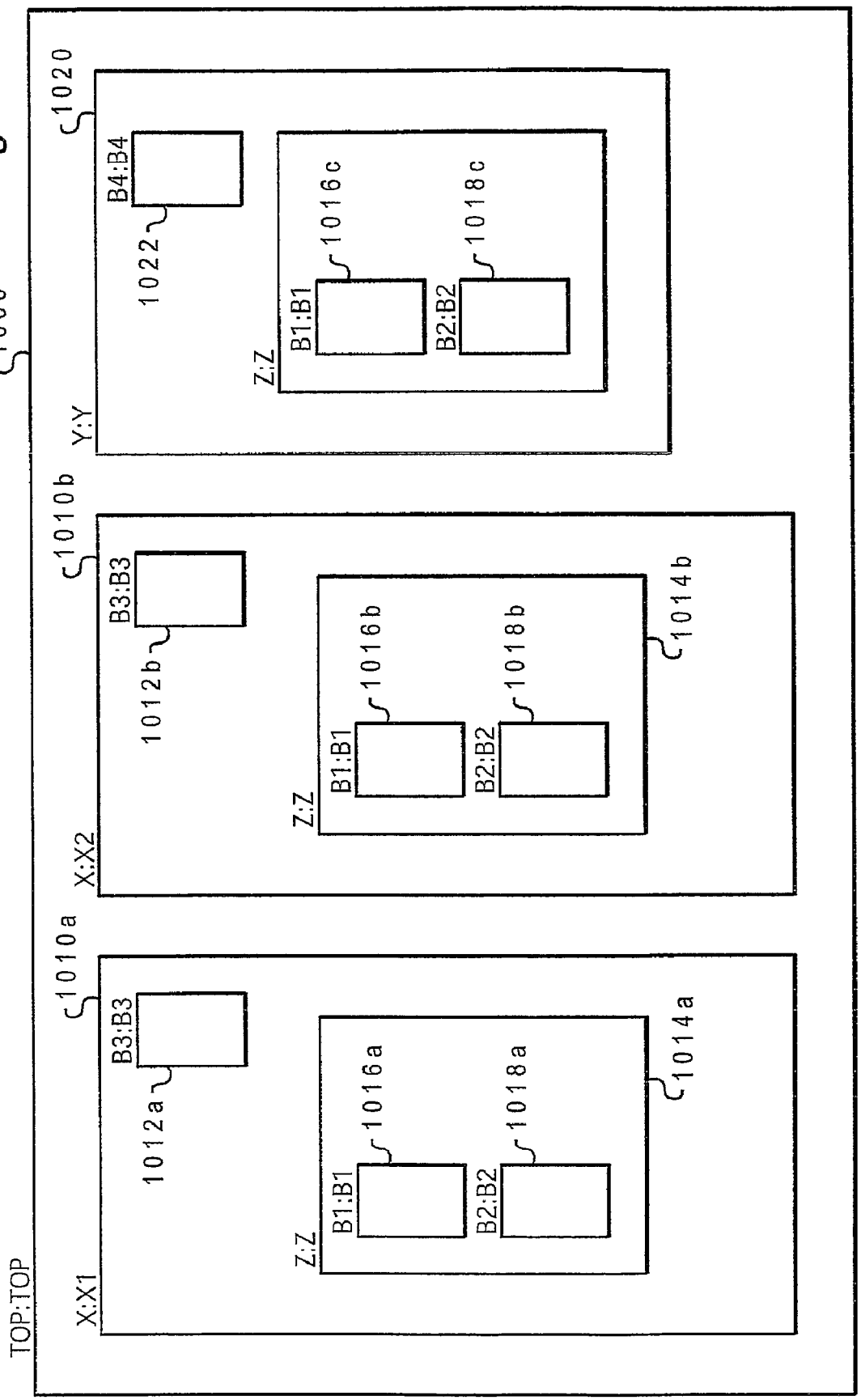

<instantiation identifier>.<instrumentation entity name>.<design entity name>.<eventname>

| 1030 | 1032 | 1034 | 1036 |
|---|---|---|---|
| X1 | B3 | X | COUNT1 |
| X1.Z | B1 | Z | COUNT1 |
| X1.Z | B2 | Z | COUNT1 |
| X2 | B3 | X | COUNT1 |
| X2.Z | B1 | Z | COUNT1 |
| X2.Z | B2 | Z | COUNT1 |
| Y | B4 | Y | COUNT1 |
| Y.Z | B1 | Z | COUNT1 |
| Y.Z | B2 | Z | COUNT1 |

<instantiation identifier>.<design entity name>.<eventname>

```
--!! Inputs
--!! event_1108_in <= A.B.[B1.count.event_1108];
--!! event_1124_in <= A.C.[B2.count.event_1124];
--!! End Inputs
```

*Fig. 7B*

```
--!! Inputs
--!! event_1108_in <= B.[count.event_1108];
--!! event_1124_in <= C.[count.event_1124];
--!! End Inputs
```

*Fig. 7C*

```
ENTITY X IS

PORT(  :
           :
         );

ARCHITECTURE example of X IS

BEGIN
    .
    .
    .
    ... HDL code for X ...
    .
    .
    .

1221 {  Y:Y
        PORT MAP(  :
                   :
                 );

1222 {  A < = ....
        B < = ....
        C < = ....

1223 {  --!! [count, countname0, clock]  < = Y.P;
        --!! Q < = Y. [B1.count.count1] AND A;
        --!! [fail, failname0, "fail msg"]  < = Q XOR B;
        --!! [harvest, harvestname0, "harvest msg"] < = B AND C;
        END;
```

```
ENTITY OVR IS                          ⌐1364
    PORT(  R_IN      :   IN std_ulogic_vector(0 .. 4);
              .
              .
              .
         ... other ports as required ...
              .
              .                                    ⌐1362
              .
           R_OV      :   OUT std_ulogic_vector(0 .. 4);
           RT        :   OUT std_ulogic
         );
                                              ⌐1363
--!! BEGIN
--!! Design Entity: FOO;

--!! Inputs (0 to 4)
--!! R_IN = > {R(0 .. 4)};    ⌐1360
--!! :
... other ports as needed ...
--!! :
--!! End Inputs
                                  ⌐1361
        ⌠ --!! Outputs
1356 ⟨  --!! <R_OVRRIDE> : R_OV(0 .. 4) = > R(0 .. 4) [RT];
        ⌡ --!! End Outputs --!! End ARCHITECTURE example of OVR IS BEGIN
    ... HDL code for entity body section ...    ⎬1358
END;
```

Fig. 9C

ENTITY FOO IS

PORT( :
           :
           :
    );

ARCHITECTURE example of FOO IS

BEGIN

.
.
.
.
.
R <= ......
.
.
.
.

1380 {
  --!! R_IN <= {R};   — 1381
  --!!
  --!!              1382
  --!! R_OV(0 to 4) <= ......;   — 1383
  --!! RT <= ......;
  --!! [override, R_OVRRIDE, R(0 .. 4), RT] <= R_OV(0 to 4);
}
         1384

*Fig. 9D*

SELECTIVE COMPILATION OF A SIMULATION MODEL IN VIEW OF UNAVAILABLE HIGHER LEVEL SIGNALS

CROSS-REFERENCE TO RELATED APPLICATION

The present invention is related to the U.S. patent application Ser. No. 10/970,468, which is incorporated herein by reference in its entirety.

BACKGROUND OF THE INVENTION

1. Technical Field

The present invention relates in general to designing and simulating digital devices, modules and systems, and in particular, to a method and system for computer simulation of digital devices, modules and systems utilizing a hardware description language (HDL) model. More particularly, the present invention relates to methods, systems, and program products for data processing in which at least some higher-level signals referenced by instrumentation logic of a simulation model are unavailable.

2. Description of the Related Art

Verifying the logical correctness of a digital design and debugging the design, if necessary, are very important steps in most digital design processes. Logic networks are tested either by actually building networks or by simulating networks on a computer. As logic networks become highly complex, it becomes necessary to simulate a design before the design is actually built. This is especially true when the design is implemented as an integrated circuit, since the fabrication of integrated circuits requires considerable time and correction of mistakes is quite costly. The goal of digital design simulation is the verification of the logical correctness of the design.

In a typical automated design process that is supported by a conventional electronic computer-aided design (ECAD) system, a designer enters a high-level description utilizing a hardware description language (HDL), such as VHDL, producing a representation of the various circuit blocks and their interconnections. The ECAD system compiles the design description into a format that is best suited for simulation. A simulator is then utilized to verify the logical correctness of the design prior to developing a circuit layout.

A simulator is typically a software tool that operates on a digital representation, or simulation model of a circuit, and a list of input stimuli representing inputs of the digital system. A simulator generates a numerical representation of the response of the circuit, which may then either be viewed on the display screen as a list of values or further interpreted, often by a separate software program, and presented on the display screen in graphical form. The simulator may be run either on a general-purpose computer or on another piece of electronic apparatus, typically attached to a general purpose computer, specially designed for simulation. In either case, a translation from an HDL description to a simulation format, hereinafter referred to as a simulation executable model or simulation model, is required.

SUMMARY OF THE INVENTION

In response to receiving HDL file(s) that specify a plurality of hierarchically arranged design entities defining a design to be simulated and that specify an instrumentation entity for monitoring simulated operation of the design, an instrumented simulation executable model of the design is built. Building the model includes compiling the HDL file(s) specifying the plurality of hierarchically arranged design entities defining the design and instantiating at least one instance of each of the plurality of hierarchically arranged design entities, and further includes instantiating an instance of the instrumentation entity within an instance of a particular design entity among the plurality of design entities and, based upon a reference in an instrumentation statement in the one or more HDL files, logically attaching an input of the instance of the instrumentation entity to an input source within the design that is outside the scope of the particular design entity.

All objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 3C illustrates exemplary sections of HDL syntax that may be utilized in accordance with the teachings of the present invention;

FIG. 6A is a block diagram illustrating a simulation model containing a number of design and instrumentation entities;

FIG. 7B depicts a set of input port mapping comments for performing hierarchical processing of simulation model events in accordance with a first embodiment of the present invention;

FIG. 7C illustrates a set of input port mapping comments for performing hierarchical processing of simulation model events in accordance with a second embodiment of the present invention;

FIG. 8B illustrates an exemplary HDL file for implementing instrumentation logic within an HDL design entity in accordance with the teachings of the present invention;

FIG. 9C depicts an exemplary HDL source file that describes instrumentation entity in accordance with the teachings of the present invention;

FIG. 9D illustrates an HDL design entity source code file wherein a set of random instrumentation comments implement the logic necessary for selectively overriding a simulation signal in accordance with the teachings of the present invention;

DETAILED DESCRIPTION OF A PREFERRED EMBODIMENT

The present invention provides for accurate and comprehensive monitoring of a digital circuit design in which a designer creates instrumentation modules, for example, utilizing the same hardware description language (HDL) as utilized for the design itself. HDLs, while suited to the needs of digital designers, can also be effectively utilized for a number of checking functions. In accordance with the present invention, instrumentation modules are utilized to monitor specified design parameters while not becoming compiled as an integral part of the design itself. Furthermore, since the instrumentation modules are written in the same HDL as utilized in the actual design, such modules are platform and simulator independent. Unlike checking done with C or C++ programs, HDL instrumentation can be compiled and run directly without loss of performance on hardware simulators.

Figure 1:
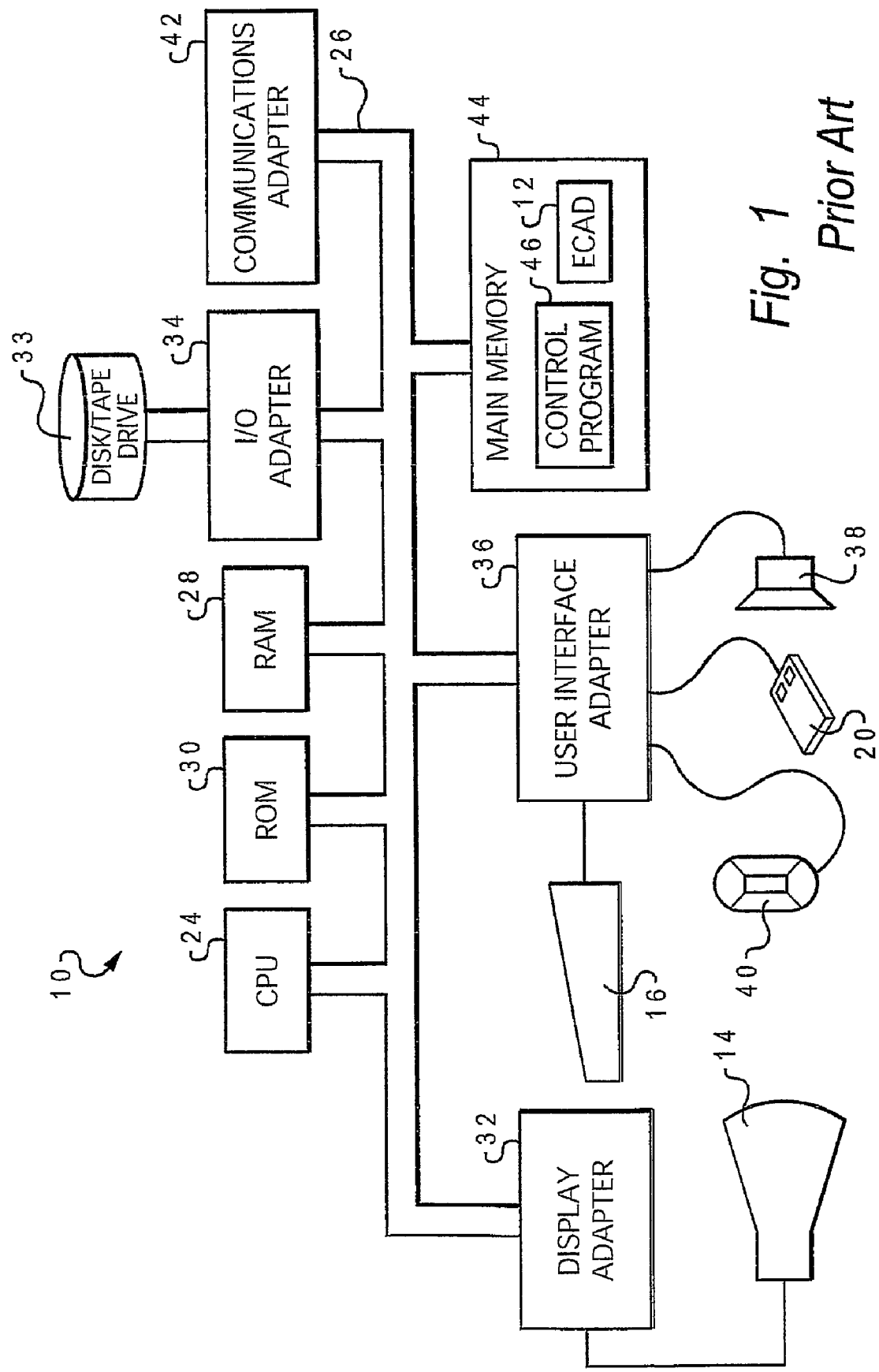
FIG. 1 depicts a exemplary data processing system that may be utilized to practice the present invention.

With reference now to the figures, and in particular with reference to FIG. 1, there is depicted a pictorial representation of a data processing system 10 with which the present invention may be advantageously utilized. As illustrated, data processing system 10 includes one or more Central Processing Units (CPUs) 24, such as a conventional microprocessor, and a number of other components interconnected via a system interconnect 26. CPU(s) 24 execute or interpret the instructions comprising computer programs, in part by performing the arithmetical and logical functions indicated by such instructions. Although not depicted in FIG. 1, CPUs such as CPU 24 typically include a control unit that organizes data and program storage in a computer memory and transfers the data and other information between the various parts of the computer system. Such CPUs also generally include one or more execution units that execute instructions to perform arithmetical and logical operations, such as addition, comparison, multiplication and so forth.

Data processing system 10 further includes random-access memory (RAM) 28, read-only memory (ROM) 30, a display adapter 32 for connecting system interconnect 26 to display device 14, and an I/O adapter 34 for connecting peripheral devices (e.g., optical, disk and tape drives 33) to system interconnect 26.

Data processing system 10 further includes user interface adapter 36 for connecting keyboard 16, mouse 20, speaker 38, microphone 40, and/or other user interface devices to system interconnect 26. Communications adapter 42 further connects data processing system 10 to one or more other computers and/or a communication network.

The nonvolatile and/or volatile internal storage of data processing system 10 (e.g., main memory 44, ROM 30, RAM 28 and/or disk/tape drive 33) stores software including a conventional operating system and additional middleware and/or application software. Such additional software includes an ECAD tool 12 that is processed by CPU(s) 24 to permit the development and verification of a digital circuit design in accordance with the present invention. ECAD tool 12 preferably presents a graphical user interface (GUI) via display device 14 with which a digital circuit designer can interact using a keyboard 16 and mouse 20. Thus, by entering appropriate inputs utilizing keyboard 16 and mouse 20, the digital circuit designer is able to develop and verify a digital circuit design according to the method described further hereinbelow. The additional software further includes a control program 46 (shown within main memory 44) that, when processed by CPU 24, carries out the operations depicted in FIG. 2C and FIG. 3D and described below.

Figure 2A:
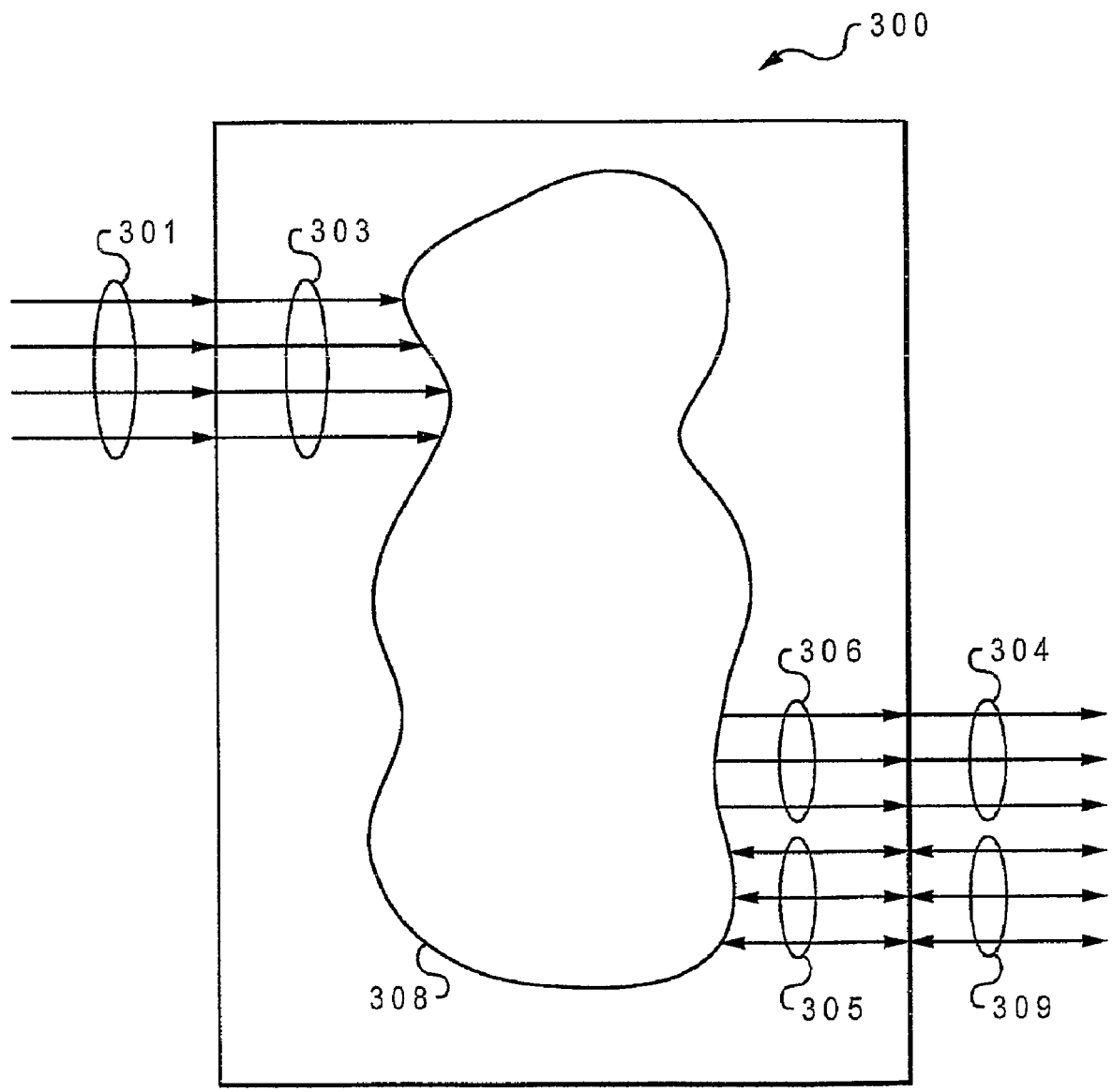
FIG. 2A is a simplified block diagram illustrating a digital design entity that may be instrumented in accordance with the teachings of the present invention.

Simulated digital circuit design models are comprised of at least one and usually many sub-units referred to hereinafter as design entities. FIG. 2A is a block diagram representation of an exemplary design entity 300. Design entity 300 is defined by a number of components: an entity name, entity ports, and a representation of the function performed by design entity 300. Each entity within a given model has a unique name (not explicitly shown in FIG. 2A) that is declared in the HDL description of each entity. Furthermore, each entity typically contains a number of signal interconnections, known as ports, to signals outside the entity. These outside signals may be primary input/outputs (I/Os) of an overall design or signals connecting to other entities within an overall design.

Typically, ports are categorized as belonging to one of three distinct types: input ports, output ports, and bi-directional ports. Design entity 300 is depicted in as having a number of input ports 303 that convey signals into design entity 300. Input ports 303 are connected to input signals 301. In addition, design entity 300 includes a number of output ports 306 that convey signals out of design entity 300. Output ports 306 are connected to a set of output signals 304. Bi-directional ports 305 are utilized to convey signals into and out of design entity 300. Bi-directional ports 305 are in turn connected to a set of bi-directional signals 309. An entity, such as design entity 300, need not contain ports of all three types, and in the degenerate case, contains no ports at all. To accomplish the connection of entity ports to external signals, a mapping technique, known as a "port map", is utilized. A port map (not explicitly depicted in FIG. 2A) indicates a specified correspondence between entity port names and external signals to which the entity is connected. When building a simulation model, ECAD tool 12 is utilized to connect external signals to appropriate ports of the entity according to a port map specification.

Finally, design entity 300 contains a body section 308 that describes one or more functions performed by design entity 300. In the case of a digital design, body section 308 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Figure 2B:
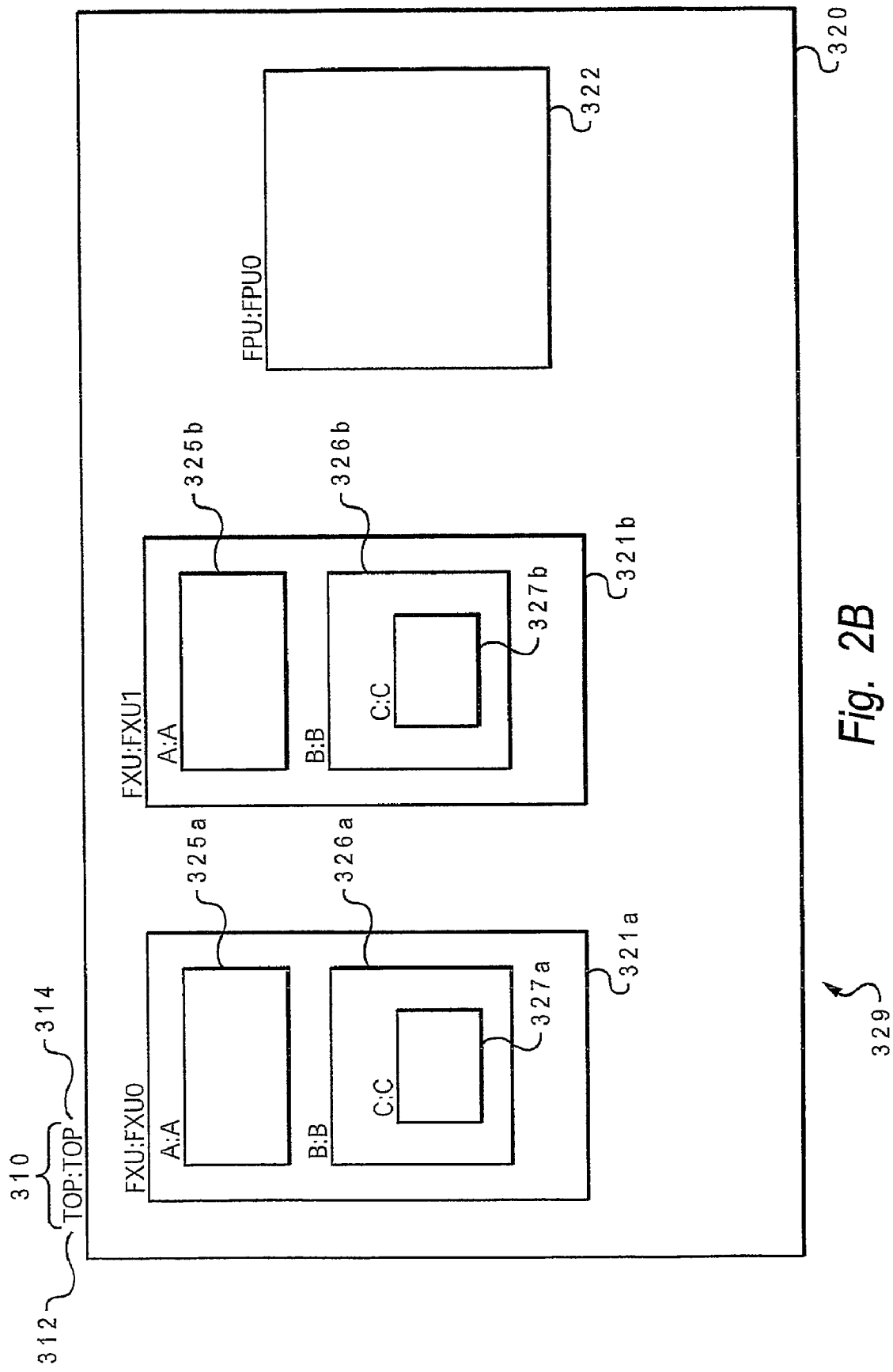
FIG. 2B depicts a simulation model that may be instrumented in accordance with the teachings of the present invention.

Referring now to FIG. 2B, there is illustrated a diagrammatic representation of an exemplary simulation model 329 that may be utilized in a preferred embodiment of the present invention. Simulation model 329 includes of multiple hierarchical entities. For visual simplicity and clarity, the ports and signals interconnecting the entities within simulation model 329 have not been explicitly shown. In any model, one and only one entity is the so-called "top-level entity". A top-level entity 320 is that entity which encompasses all other entities within simulation model 329. That is to say, top-level entity 320 instantiates, either directly or indirectly, all descendant entities within a design. Simulation model 329 includes of top-level entity 320 which directly instantiates two instances, 321a and 321b, of an FXU entity 321 and a single instance of an FPU entity 322. Each instantiation has an associated description, which contains an entity name and a unique instantiation name. For top-level entity 320, description 310 is labeled "TOP:TOP". Description 310 includes an entity name 312, labeled as the "TOP" preceding the colon, and also includes an instantiation name 314, labeled as the "TOP" following the colon.

It is possible for a particular entity to be instantiated multiple times as is depicted with instantiations 321a and 321b of FXU entity 321. Instantiations 321a and 321b are distinct instantiations of FXU entity 321 with instantiation names FXU0 and FXU1 respectively. Top-level entity 320 is at the highest level within the hierarchy of simulation model 329. An entity that instantiates a descendant entity will be referred to hereinafter as an "ancestor" of the descendant entity. Top-level entity 320 is therefore the ancestor that directly instantiates FXU entity instantiations 321a and 321b. At any given level of a simulation model hierarchy, the instantiation names of all instantiations must be unique.

In addition to FXU entity instantiations 321a and 321b, top-level entity 320 directly instantiates a single instance of a FPU entity 322 having an entity name FPU and instantiation name FPU0. Within an entity description, it is common for the entity name to match the instantiation name when only one instance of that particular entity is placed at a given level of a simulation model hierarchy. However, this is not required as shown by entity 322 (instantiation name FPU0, entity name FPU).

Within instantiation 321a of FXU entity 321, single instance entities 325a and 326a of entity A 325 and entity B 326 respectively, are directly instantiated. Similarly, instantiation 321b of the same FXU entity contains instantiations 325b and 326b of entity A 325 and entity B 326 respectively. In a similar manner, instantiation 326a and instantiation 326b each directly instantiate a single instance of entity C 327 as entities 327a and 327b respectively. The nesting of entities within other entities can continue to an arbitrary level of complexity provided that all entities instantiated, whether singly or multiply, have unique entity names and the instantiation names at any given level of the hierarchy are unique with respect to one another. Each entity is constructed from one or more HDL files that contain the information necessary to describe the entity.

Associated with each entity instantiation is a so called "instantiation identifier". The instantiation identifier for a given instantiation is a string built from the enclosing entity instantiation names proceeding from the top-level entity instantiation name. For example, the instantiation identifier of instantiation 327a of entity C 327 within instantiation 321a of FXU entity 321 is "TOP.FXU0.B.C". This identifier serves to uniquely identify each instantiation within a simulation model.

Figure 2C:
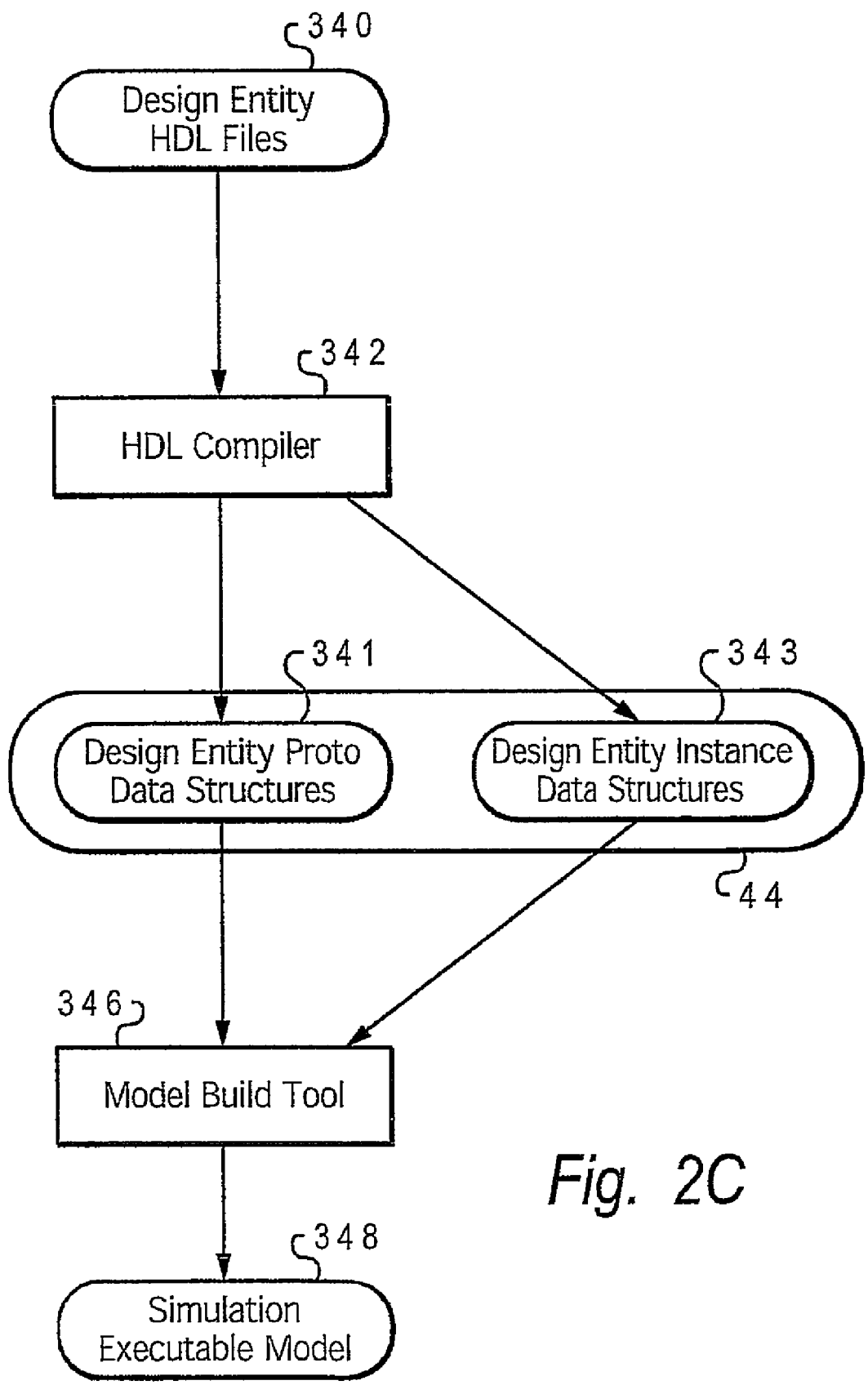
FIG. 2C is a flow diagram illustrating of a model build process that may be implemented in accordance with the teachings of the present invention.

Referring now to FIG. 2C, there is depicted a flow diagram of a model build process which may be implemented in a preferred embodiment of the present invention. The process begins with one or more design entity HDL source code files 340. HDL compiler 342 processes HDL file(s) 340 beginning with the top level entity of a simulation model and proceeding in a recursive fashion through all HDL file(s) describing a complete simulation model.

HDL compiler 342 also creates two sets of data structures, design entity proto data structures 341 and design entity instance data structures 343, in memory 44 of computer system 10. Design entity proto data structures 341 and design entity instance data structures 343, serve as a memory image of the contents of a simulation executable model 348. Data structures 341 and 343 are passed, via memory 44, to a model build tool 346 that processes data structures 341 and 343 into simulation executable model 348.

It will be assumed hereinafter that each entity is described by a single HDL file. Depending on convention or the particular HDL in which the current invention is practiced, this restriction may be required. However, in certain circumstances or for certain HDLs it is possible to describe an entity by utilizing more than one HDL file. Those skilled in the art will appreciate and understand the extensions necessary to practice the present invention if entities are permitted to be described by multiple HDL files. Furthermore, it will be assumed that there is a direct correspondence, for each entity, between the entity name and both of the following: the name of the HDL file representing the entity, and the name of the proto file for the entity.

In the following description, an HDL source code file corresponding to a given entity will be referred to by an entity name followed by ".vhdl". For example, the HDL source code file that describes top-level entity 320 will be referred to as TOP.vhdl. This labeling convention serves as a notational convenience only and should not be construed as limiting the applicability of the present invention to HDLs other than VHDL.

Returning to FIG. 2B, it can be seen that each entity may instantiate, either directly or indirectly, one or more other entities. For example, the FXU entity directly instantiates A entity 325 and B entity 326. Furthermore, B entity 326 directly instantiates C entity 327. Therefore, FXU entity 321 instantiates, directly or indirectly, A entity 325, B entity 326 and C entity 327. Those entities, that are directly or indirectly instantiated by another entity, will be referred to hereinafter as "descendants". The descendants of top level entity 320 are FXU entity 321, FPU entity 322, A entity 325, B entity 326, and C entity 327. It can be seen that each entity has a unique set of descendants and that each time an entity is instantiated, a unique instance of the entity and its descendants is created. Within simulation model 329, FXU entity 321 is instantiated twice, FXU:FXU0 321a and FXU:FXU1 321b, by top-level entity 320. Each instantiation of FXU entity 321 creates a unique set of instances of the FXU, A, B, and C entities.

Returning to FIG. 2C, HDL compiler 342 creates an image of the structure of a simulation model in main memory 44 of computer system 10. This memory image is comprised of the following components: "proto" data structures 341 and "instance" data structures 343. A proto is a data structure that, for each entity in the model, contains information about the ports of the entity, the body contents of the entity, and a list of references to other entities directly instantiated by the entity (in what follows, the term "proto" will be utilized to refer to the in-memory data structure described above).

An instance data structure is a data structure that, for each instance of an entity within a model, contains the instance name for the instance, the name of the entity the instance refers to, and the port map information necessary to interconnect the entity with external signals. During compilation, each entity will have only one proto data structure, while, in the case of multiple instantiations of an entity, each entity may have one or more instance data structures.

Figure 2D:
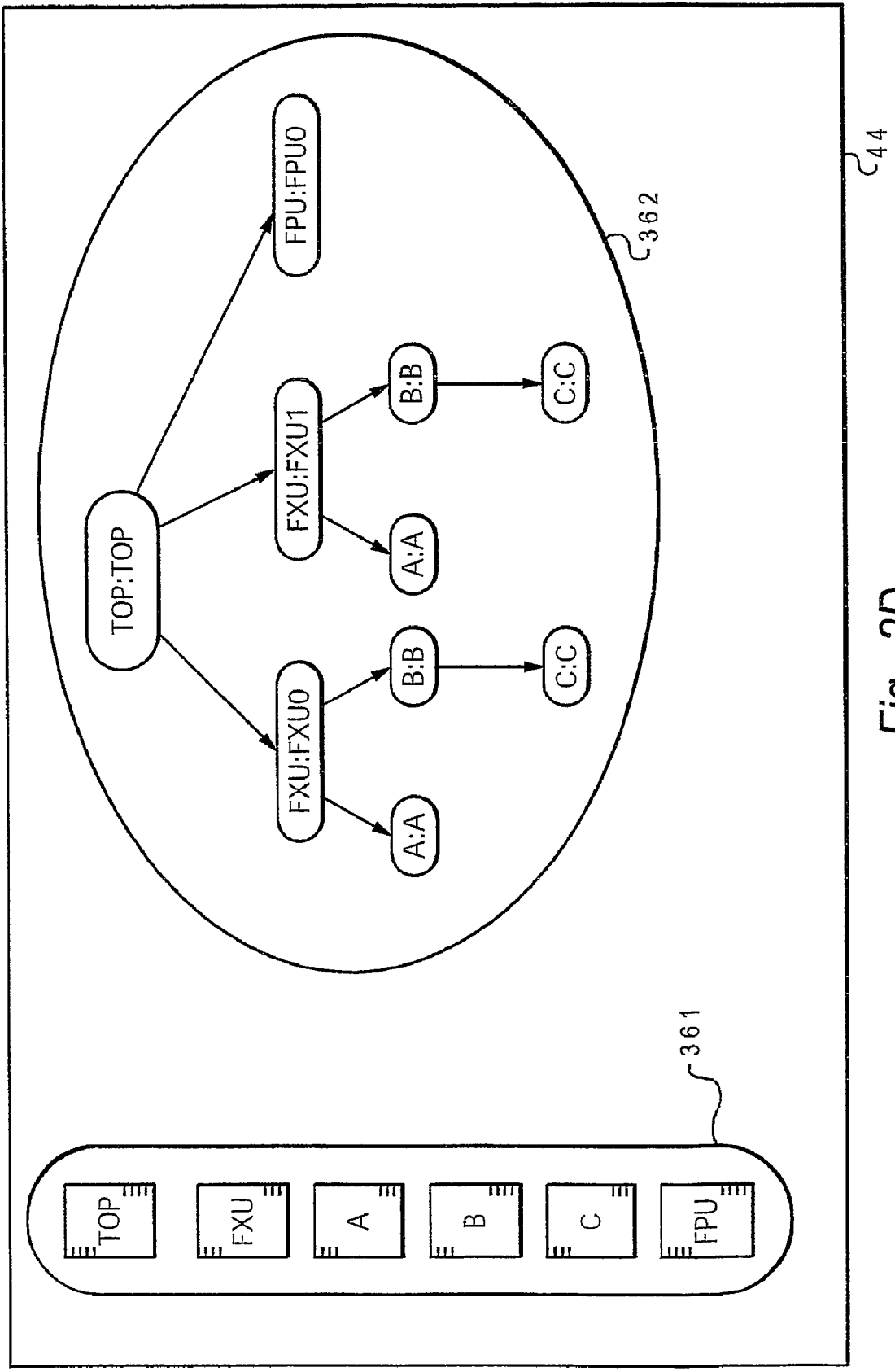
FIG. 2D is a block diagram depicting data structures that may be instrumented in accordance with the teachings of the present invention.

With reference now to FIG. 2D there is depicted a block diagram representing compiled data structures, which may be implemented in a preferred embodiment of the present invention. Memory 44 contains proto data structures 361, one for each of the entities referred to in simulation model 329. In addition, instantiations in simulation model 329 are represented by instance data structures 362. Instance data structures 362 are connected by means of pointers indicating the hierarchical nature of the instantiations of the entities within simulation model 329. Model build tool 346 in FIG. 2C processes the contents of memory 44 into memory data structures in order to produce simulation executable model 348.

In order to instrument simulation models, the present invention makes use of entities known as "instrumentation entities," which contrast with the entities constituting a design under simulation, referred to herein as "design entities". As with design entities, instrumentation entities are described by one or more HDL source code files and include a number of signal ports, a body section, and an entity name. In what follows, it will be assumed that an instrumentation entity is described by a single HDL file. Those skilled in the art will appreciate and understand extensions necessary to practice the current invention for an instrumentation entity that is described by multiple HDL files. Each instrumentation entity is associated with a specific design entity referred to hereinafter as the "target entity".

Figure 3A:
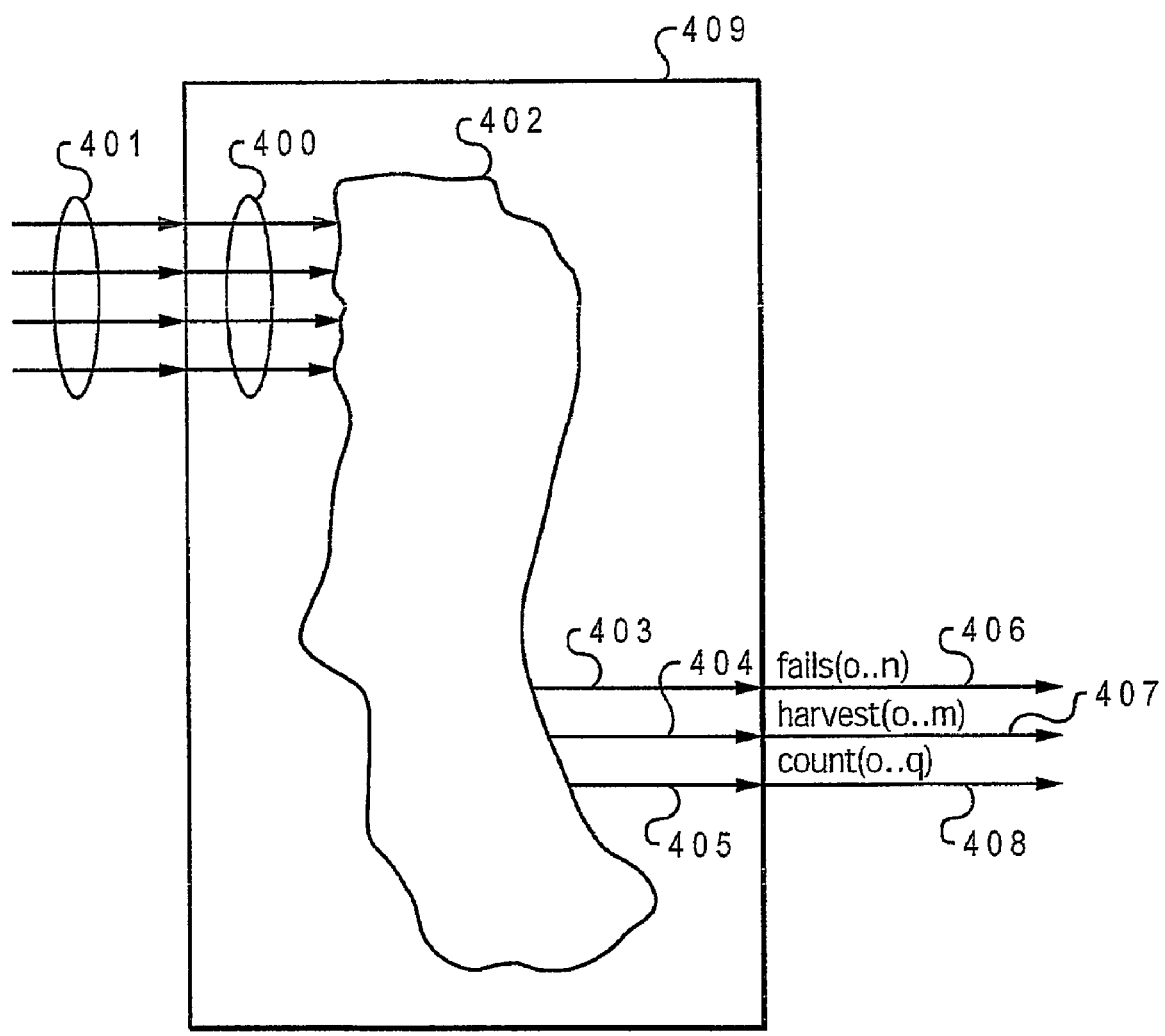
FIG. 3A is a simplified block diagram representative of an instrumentation entity.

With reference now to FIG. 3A, there is illustrated a block diagram representation of an instrumentation entity 409. Instrumentation entity 409 includes a number of input ports 400 that are connected to signals 401 within a target entity (not depicted in FIG. 3A). A body section 402 contains logic necessary to detect occurrences of specified conditions within the target entity and generate simulation model "events" with respect to signals 401. At least three distinct types of events may be generated: "count" events, "fail" events, and "harvest" events, each described below in turn. Body section 402 contains internal logic for detecting occurrences of conditions precipitating generation of these events. A set of multi-bit output ports 403, 404, and 405 are connected to external instrumentation logic (depicted in FIG. 3B) by means of external signals 406, 407, and 408. Output ports 403, 404, and 405 thus provide the connection from the internal logic in body section 402 to the external instrumentation logic which is utilized to indicate the occurrence of count, failure and harvest events.

A failure event is a sequence of signal values that indicate a failure in the correct operation of the simulation model. Each instrumentation entity monitors the target entity for any desired number of failure events. Each occurrence of a failure event is assigned to a particular signal bit on output port 403. Logic within body section 402 produces an active high pulse on a specified bit of signal 403 when a failure condition is detected. Such activation of signal 403 is defined as a failure event. This error indication is conveyed by means of external signal 406 to external instrumentation logic (depicted in FIG. 3B as external instrumentation logic block 420), which flags the occurrence of the failure event.

A count event is a sequence of signal values that indicate the occurrence of an event within a simulation model for which it would be advantageous to maintain a count. Count events are utilized to monitor the frequency of occurrence of specific sequences within a simulation model. Each instrumentation entity can monitor the target entity for any desired number of count events. Each count event is assigned to a particular signal bit on output port 405. Logic block 402 contains the logic necessary to detect the occurrence of the desired count events and produces an active high pulse on the specified bit of signal 405 when a count event is detected. This count indication is conveyed by means of external signal 408 to instrumentation logic, which contains counters utilized to record the number of occurrences of each count event.

The third event type, a harvest event, is a sequence of signal values that indicate the occurrence of a specific operative circumstance, which would be advantageous to be able to reproduce. When a harvest event occurs, a register within an external instrumentation logic block is loaded to indicate at what point within a simulation run the event occurred, and a flag is set to indicate the occurrence of the specific circumstance. The details of the simulation run can thus be saved in order to recreate the specific circumstance monitored by the harvest event. Logic block 402 contains the logic necessary to detect the harvest events.

Each instrumentation entity can detect any desired number of harvest events that are each assigned to a particular signal bit on output port 404. Logic within block 402 produces an active high pulse on the specified bit of signal 404 when a harvest event is detected. This harvest event detection is conveyed by means of external signal 407 to external instrumentation logic that contains a register and flag for each harvest event. The register is utilized to record at which point in the simulation run the harvest event occurred, and the flag is utilized to indicate the occurrence.

Figure 3B:
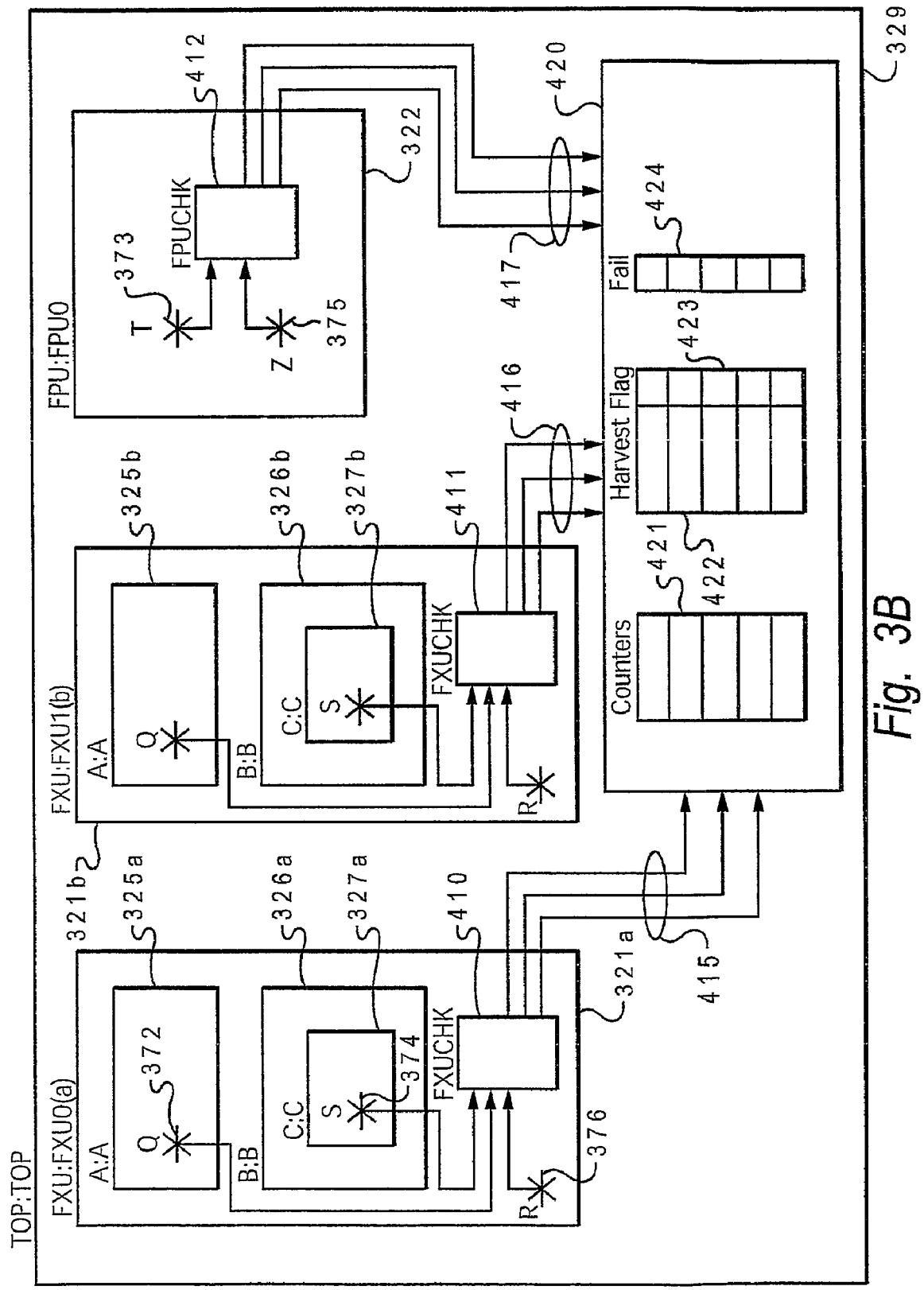
FIG. 3B is a simplified block diagram of a simulation model instrumented in accordance with the teachings of the present invention.

With reference now to FIG. 3B, there is depicted a block diagram representation of simulation model 329 instrumented in accordance with the teachings of the present invention. As can be seen in FIG. 3B, an instance 410 and an instance 411 of an instrumentation entity FXUCHK are utilized to monitor instances 321a and 321b of an FXU entity. For each FXU instantiations of 321a and 321b, an FXUCHK instantiation, 410 and 411 respectively, is automatically generated by the mechanism of the present invention. In a similar fashion, instrumentation entity FPUCHK 412 is instantiated to monitor FPU entity 322.

As depicted in FIG. 3B, entity FXUCHK monitors a signal Q 372, a signal R 376, and a signal S 374 within each of instances 321a and 321b of the FXU entity. Signal Q 372, is a signal within the instances 325a and 325b of descendant entity A. Likewise, signal S 374 is a signal within descendant entity C that resides within descendant entity B. Finally, signal R 376 occurs directly within FXU entity 321. Similarly, entity FPUCHK 412 monitors signal T 373 and signal Z 375 within the instance of FPU entity 322. An instrumentation entity may thus monitor any signal within a target entity or the target entity's descendent entities; further, in at least some embodiments, signals outside the target entity, including those within a parent entity at a higher level of design hierarchy or within other branches of the design hierarchy, can also be monitored, as discussed further below with reference to FIGS. 10A-10B, 11 and 12.

Each instrumentation entity is connected by means of fail, count, and harvest signals to instrumentation logic block 420 containing logic for recording occurrences of each of the three event types. For the count events monitored in simulation model 329, a set of counters 421 is utilized to count the number of occurrences of each count event. In a similar manner, a set of flags 424 is utilized to record the occurrence of failure events. Finally, a set of counters 422 and flags 423 are combined and utilized to record the point at which a harvest event occurs and its occurrence, respectively. In one embodiment of the present invention, a cycle number is captured and stored utilizing counters 422 and flags 423 to record a harvest event.

To facilitate instantiation and connection of instrumentation entities, instrumentation entity HDL source code files include a specialized comment section, hereinafter referred to as "instrumentation entity description", that indicates the target entity, the signals within the target entity to be monitored, and information specifying types of events to be monitored.

With reference now to FIG. 3C, there is illustrated an exemplary HDL file 440 that describes instrumentation entity FXUCHK depicted in FIG. 3B. HDL file 440 utilizes the syntax of the VHDL hardware description language. In the VHDL language, lines beginning with two dashes ("--") are recognized by a compiler as being comments. The method and system of the present invention utilize comments of a non-conventional form to indicate information about an instrumentation entity. FIG. 3C depicts one embodiment of the present invention in which comments begin with two exclamation points in order to distinguish these comments from conventional comments in instrumentation HDL file 440. It will be appreciated by those skilled in the art that the exemplary syntax utilized in FIG. 3C for the provision of unconventional comments is but one of many possible formats.

Within HDL file 440, the I/O ports of a FXUCHK entity are declared in entity declaration 450. Within entity declaration 450, three input ports, S_IN, Q_IN, and R_IN, respectively, are declared. Input ports, S_IN, Q_IN, and R_IN, will be attached to signal S, 374, signal Q, 372, and signal R, 376 respectively as described below. Input port, CLOCK, is also declared and will be connected to a signal, CLOCK, within the FXU entity. In addition, three output ports: fails (0 to 1), counts(0 to 2), and harvests(0 to 1), are declared. These output ports provide failure, count, and harvest signals for two failure events, three count events, and two harvest events. The names of the output ports are fixed by convention in order to provide an efficient means for automatically connecting these signals to instrumentation logic block 420.

A set of instrumentation entity descriptors 451 is utilized to provide information about the instrumentation entity. As illustrated in FIG. 3C, descriptor comments 451 may be categorized in a number of distinct sections: prologue and entity name declaration 452, an input port map 453, a set of failure message declarations 454, a set of counter declarations 455, a set of harvest declarations 456, and an epilogue 457.

The prologue and entity name 452 serve to indicate the name of the particular target entity that the instrumentation entity will monitor. Prologue and entity name declaration 452 also serves as an indication that the instrumentation entity description has begun. Specifically, the comment "--!! Begin" within prologue and entity name 452, indicates that the description of an instrumentation entity has begun. The comment "--!! Design Entity: FXU" identifies the target entity which, in HDL file 440, is design entity FXU. This declaration serves to bind the instrumentation entity to the target entity.

Input port map 453 serves as a connection between the input ports of an instrumentation entity and the signals to be monitored within the target entity. The comments begin with comment "--!! Inputs" and end with comment "--!! End Inputs". Between these comments, comments of the form "--!! inst_ent_port_name=>trgt_ent_signal_name" are utilized, one for each input port of the instrumentation entity, to indicate connections between the instrumentation entity ports and the target entity signals. The inst_ent_port_name is the name of the instrumentation entity port to be connected to the target entity signal. The trgt_ent_signal_name is the name of the signal within the target entity that will be connected to the instrumentation entity port.

In some cases a signal to be monitored lies within a descendant of a target entity. This is the case for signal S 374, which is embedded within entity C which is a descendant of entity B 326 and target FXU entity 321. Input port map 453 includes an identification string for signal S 374, which includes the instance names of the entities within the target entity each separated by periods ("."). This identification string is pre-pended to the signal name. The signal mapping comment within input port map 453 for signal S 374 is therefore as follows:

--!! S_IN=>B.C.S;

This syntax allows an instrumentation entity to connect to any signal within the target entity or the target entity's descendant entities. A signal appearing on the top level of the target design entity, has no pre-pended entity names; and therefore, has the following signal mapping comment:

--!! R_IN=>R;

For signals on the top level of the target entity, a special connection method is provided. If the signal to be connected to has the same name as its corresponding signal in the port map of the instrumentation entity, no input port mapping comment is required and the signal will be automatically connected if no such comment is present. In other words, if the input port mapping comment is of the form:

--!! signal=>signal;

where signal is a legal signal name without periods ("."), then the input port mapping comment is not required and the system of the present invention will automatically make the connection. It is also possible to provide comments of the form given above to explicitly denote the signal connection. This mechanism is only operative for signals on the top level of the target entity.

Failure message declarations 454 begin with a comment of the form "--!! Fail Outputs;", and end with a comment of the form "--!! End Fail Outputs;". Each failure event output is associated with a unique event name and a failure message. This message may be output by the simulation run-time environment upon detecting a failure event. The unique failure event name is utilized to identify the specific failure event within the model. Each failure event signal may be declared by a comment of the form "--!! n: <eventname>"failure message";" where n is an integer denoting the failure event to which the message is associated, <eventname> is the unique failure event name, and "failure message" is the message associated with the particular failure event. One and only one failure message declaration comment must be provided for each failure event monitored by the instrumentation entity.

Counter declaration comments 455 begin with a comment of the form "--!! Count Outputs;" and end with a comment of the form "--!! End Count Outputs;". Each count event output is associated with a unique variable name. This name is associated with a counter in counter logic 421 FIG. 3B. The variable name provides a means to identify and reference the particular counter associated with a particular count event. Thus, a comment of the form "--!! n: <varname> qualifying_signal [+/−];" is associated with each counter event output. Within this convention, n is an integer denoting which counter event in the instrumentation module is to be associated with a variable name "varname," and qualfying_signal is the name of a signal within a target design entity utilized to determine when to sample the count event pulse, as will be further described hereinbelow. The parameter "qualifying_signal" is followed by A+/−A to specify whether the qualifying signal will be a high active qualifying signal or a low active qualifying signal.

Harvest declarations 456 begin with a prologue comment of the form "--!! Harvest Outputs;" and end with a comment of the form "--!! End Harvest Outputs;". Each harvest event output is associated with a unique event name and a message that may be output by the simulation runtime environment when a harvest event has occurred during a simulation run. Each harvest event signal is declared in the form "--!! n: <eventname>"harvest message";" where n is an integer denoting which harvest event the message is to be associated with, <eventname> is the unique harvest event name and "harvest message" is the message to be associated with the particular harvest event. One, and only one, harvest message declaration comment must be provided for each harvest event monitored by the instrumentation entity.

Harvest messages and event names, fail messages and event names, and counter variable names for a simulation model are included in a simulation executable model and lists of all the events within the model are produced in separate files at model build time. In this manner, each simulation model includes the information for each event monitored and a separate file containing this information for each event is available. Furthermore, as will be described below, the model build process names each event within the model (count, fail and harvest) model in such a manner as to insure that each event has a unique name with certain useful properties.

Finally, epilogue comment 457 includes a single comment of the form "--!! End;", indicating the end of descriptor comments 451. The remainder of instrumentation entity HDL file 440 that follows the I/O declarations described above is an entity body section 458. In entity body section 458, conventional HDL syntax is utilized to define internal instrumentation logic necessary to detect the various events on the input port signals and convey these events to the output port signals.

In addition to descriptor comments 451, that are located in the HDL source code file for an instrumentation entity, an additional comment line is required in the target entity HDL file. A comment of the form "--!! Instrumentation: name.vhdl", where name.vhdl is the name of the instrumentation entity HDL file, is added to the target entity HDL source code file. This comment provides a linkage between the instrumentation entity and its target entity. It is possible to have more than one such comment in a target entity when more than one instrumentation entity is associated with the target entity. These HDL file comments will hereinafter be referred to as "instrumentation entity instantiations".

Figure 3D:
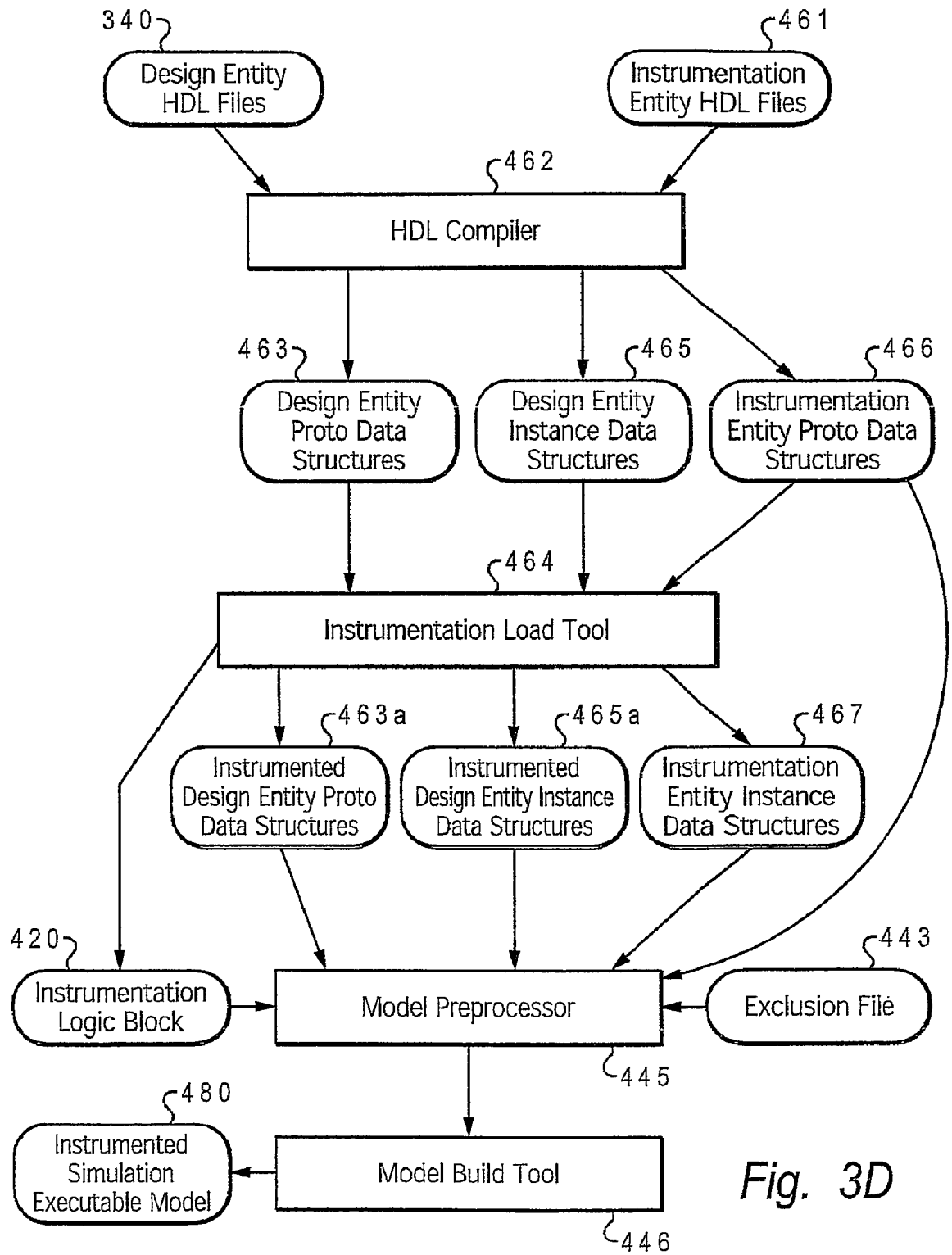
FIG. 3D is a flow diagram depicting a model build process in accordance with the teachings of the present invention.

With reference now to FIG. 3D, there is depicted an exemplary model build process in accordance with the teachings of the present invention. In this model build process, instrumentation load tool 464 is utilized to alter the in-memory proto and instance data structures of a simulation model thereby adding instrumentation entities to the simulation model. Instrumentation load tool 464 utilizes descriptor comments 451 within instrumentation HDL files 461 to create instance data structures for the instrumentation entities within a simulation model.

The model build process of FIG. 3D begins with design entity HDL files 340 and instrumentation entity HDL files 460. HDL compiler 462 compiles design entity HDL files 340 and instrumentation entity HDL files 461 in order to produce in-memory design proto data structures 463 and design instance data structures 465 for the design entities of a simulation model. HDL compiler 462 also creates in-memory instrumentation proto data structures 466 for the instrumentation entities of a simulation model.

In order to minimize processing overhead HDL compiler 462 neither reads nor processes descriptor comments 451. However, HDL compiler 462 does recognize instrumentation entity instantiation comments within target entity HDL files. As such, HDL compiler 462 cannot create instance data structures instrumentation entity data structures 467. The creation of instance data structures requires interconnection information contained within descriptor comments 451 not processed by HDL compiler 462. HDL compiler 462 does, however, create instrumentation proto data structures 466.

The in-memory design proto data structures 463, design instance data structures 465, and instrumentation entity proto data structures 466 are processed by instrumentation load tool 464. Instrumentation load tool 464 examines design entity proto data structures 463 and design entity instance data structures 465 to determine those design entities that are target entities. This examination is accomplished by utilizing a particular comment format as previously described.

For each target entity loaded from design entity HDL files 340, instrumentation load tool 464 must alter its design proto data structure 463 and its design instance data structure 465 to instantiate an associated instrumentation entity. An instrumented design proto data structure 463a and instrumented design instance data structure 465a are thereby produced. In addition, instrumentation load tool 464 creates an instrumentation instance data structure 467 for each instrumentation entity associated with the current design entity.

Finally, instrumentation load tool 464 creates a unique proto and instance data structure for instrumentation logic block 420 and connects the fail, harvest, and count event signals from each instrumentation entity instantiation to instrumentation logic block 420. In-memory proto and instance data structures 463a, 465a, 467, 466, instrumentation logic block 420, and optionally an exclusion list (which may be contained in an exclusion file 443) are received and processed by a model preprocessor 445.

Figure 3E:
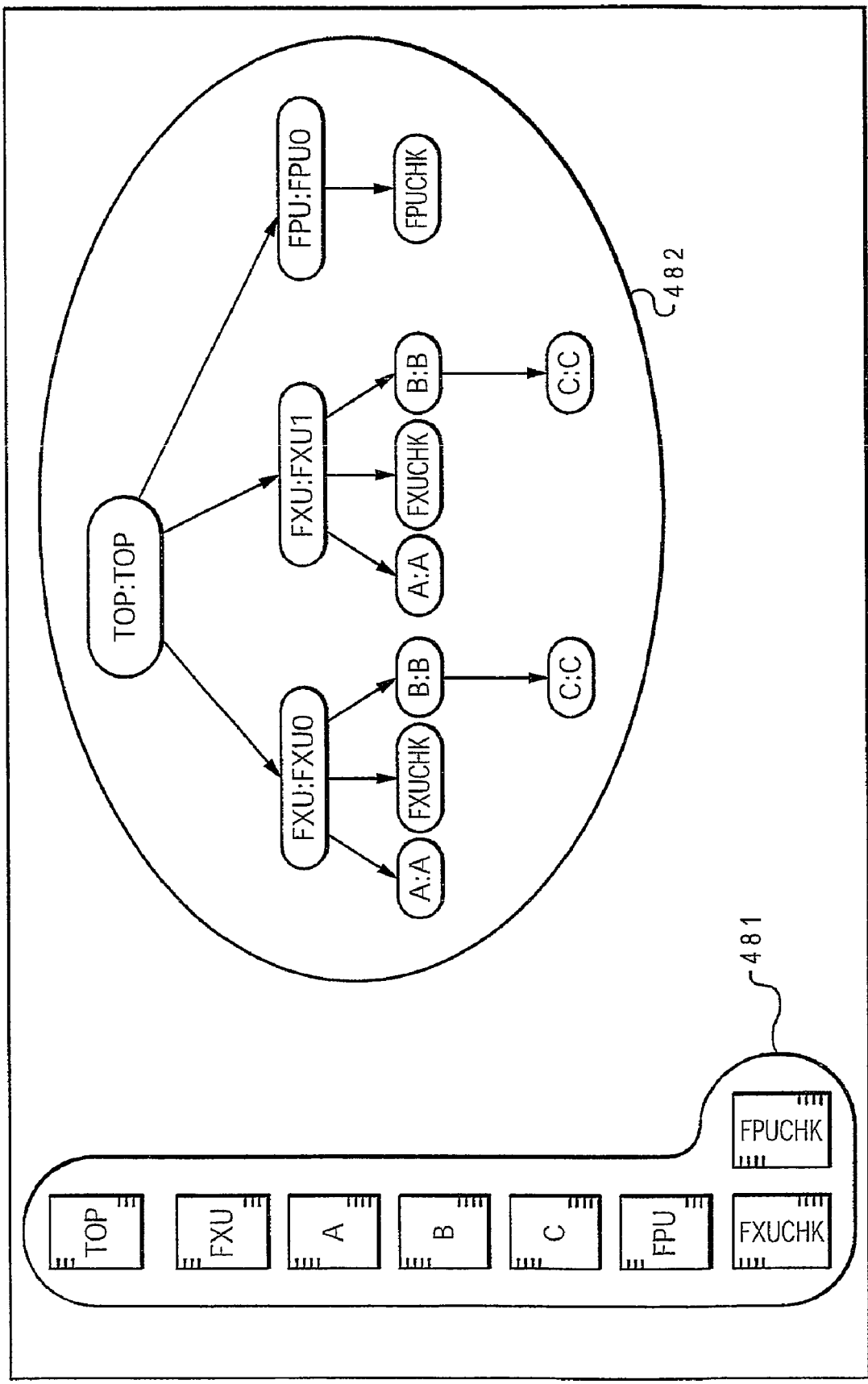
FIG. 3E is a block diagram representation of memory data structures constructed in accordance with the teachings of the present invention.

In an exemplary embodiment, model preprocessor 445 performs at least two functions. First, model preprocessor 445 "flattens" the simulation model. As depicted in FIG. 3E, in-memory proto and instance data structures 463a, 465a, 467, 466 describe the simulation model in an "unflattened" representation. The unflattened representation of the simulation model includes a set of proto data structures 481 containing a single proto for each respective instrumentation or design entity belonging to the simulation model. Each such proto serves as a template for all the instances of that entity within the simulation model. The unflattened representation further includes an instance data structure 482 containing pointers and references to those entities that describe the overall structure of the simulation model. For example, FIG. 3E depicts an exemplary instance data structure 482 indicating an instantiation of instrumentation entity FXUCHK in each of the two instances of design entity FXU and an instantiation of instrumentation entity FPUCHK within the single instance of design entity FPU. Instance data structure 482 thus indicates the hierarchical nature of the instantiations of the design and instrumentation entities within the simulation model utilizing pointers and references to proto data structures 481.

Model preprocessor 445 "flattens" the simulation model by creating a "sea of gates" representation of the simulation model containing explicit copies of all the gates and other logic elements of each instance of each entity within the simulation model. Thus, the flattened representation of the simulation model contains, in addition to or in lieu of instance data structure 482, explicit copies of all the logic elements of the design and instrumentation entities rather than merely pointers to proto data structures 481.

Second, the flattening of the simulation model by model preprocessor 445 facilitates the selective removal of individual instances of a given instrumentation event from some or all instrumentation entity instances instantiating the event. In one preferred embodiment, the event instances to be removed are indicated by an exclusion list contained in one or more exclusion files.

The flattened simulation model produced by model preprocessor 445 is passed to model build tool 446, which produces an instrumented simulation executable model 480. Subsequent execution of instrumented simulation executable model 480 simulates operation of the digital design modeled by instrumented simulation executable model 480 and facilitates data collection regarding the operation of the digital design via the instrumentation described herein.

Figure 4:
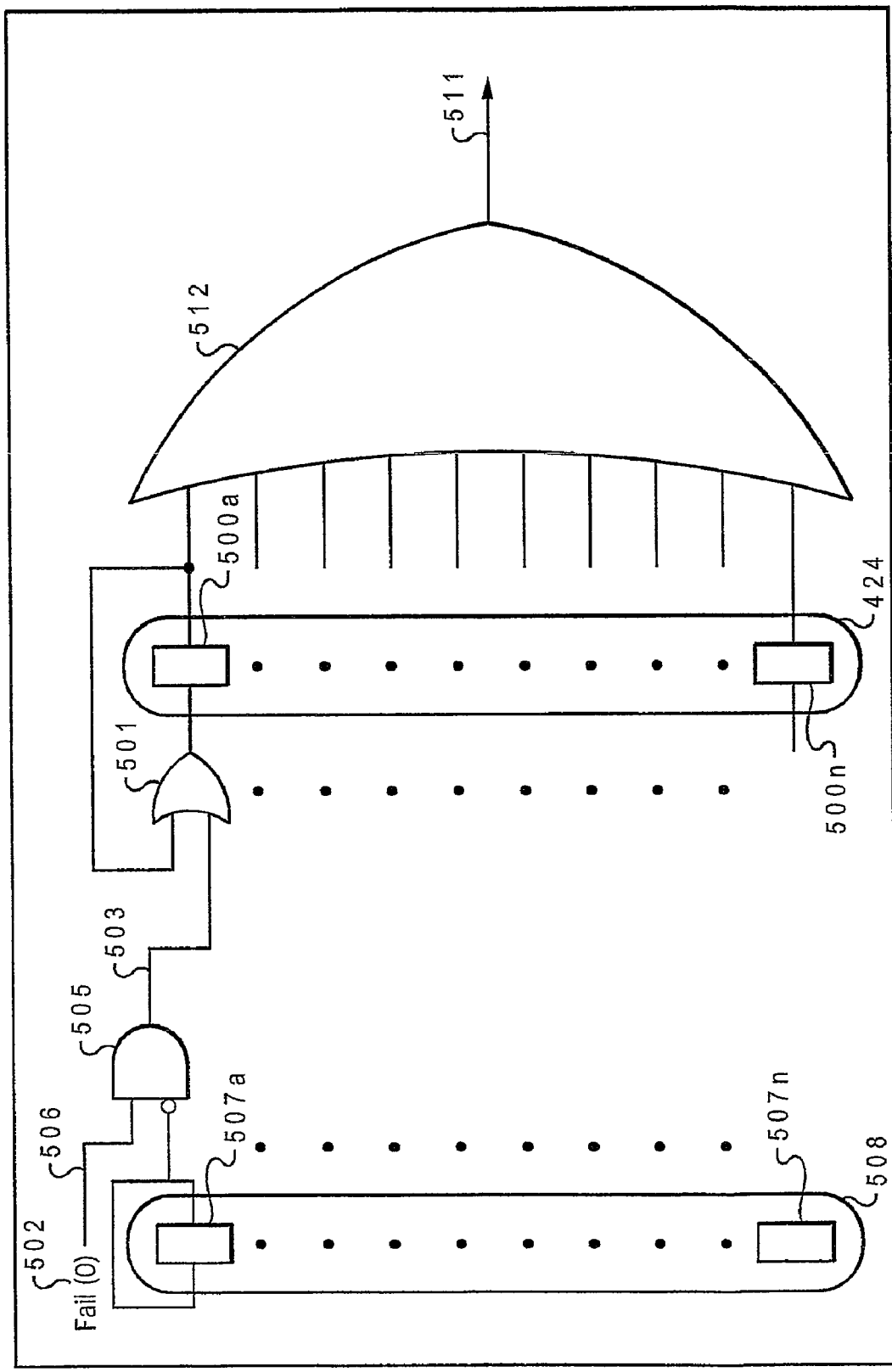
FIG. 4 is a logic diagram representation of a runtime disable mechanism in accordance with the teachings of the present invention.

With reference now to FIG. 4, failure flags 424 of instrumentation logic block 420 are depicted in greater detail. Failure flags 424 are registers 500a-500n utilized to accept and store an indication of the occurrence of a failure event. In what follows, the operation of a single failure flag for a particular failure event 502 will be discussed. The operation of all failure flags is similar.

Register 500a holds a value that represents whether a failure event 502 has occurred or not. Register 500a is initially set to a value of '0' by the simulation run-time environment at the beginning of a simulation run. When failure event 502, if enabled at register 507a, occurs, register 500a is set to a value of a logical '1', thereby indicating the occurrence of a failure event. Register 500a is driven by logical OR gate 501. Logical OR gate 501 performs a logical OR of the output of register 500a and a qualified failure signal 503 to create the next cycle value for register 500a. In this manner, once register 500a is set to a logical '1' by the occurrence of an enabled failure event, register 500a maintains the value of a logical '1' until reset by the simulation runtime environment. Likewise, register 500a maintains a value of '0' from the beginning of the simulation run until the occurrence of the failure event, if enabled.

Qualified failure signal 503 is driven by logical AND gate 505. Logical AND gate 505 produces, on qualified failure signal 503, the logical AND of failure signal 506 and the logical NOT of register 507a. Register 507a serves as an enabling control for qualified failure signal 503. If register 507a contains a value of '0', logical AND gate 505 will pass failure event signal 506 unaltered to qualified failure signal 503. In this manner, the monitoring of the failure event is enabled. Registers 507a-507n are set, by default, to a value of '0'. However, if register 507a contains a value of a '1', qualified failure signal 503 will remain at a value of '0' irrespective of the value of failure event signal 506, thereby disabling the monitoring of failure event 502. In this manner, register 508, which includes registers 507a-507n, can mask the occurrence of any subset of failure events in the overall simulation model from registers 500a-500n.

To efficiently implement the ability to selectively disable the monitoring of failure events, the simulation run-time environment includes a function that allows a user to disable monitoring of a specific failure event for a given instrumentation entity. This function will automatically set the appropriate registers among registers 507a-507n within register 508 to disable the monitoring of a particular failure event for every instance of the instrumentation entity within the overall simulation model. Instrumentation load tool 464 and model build tool 446 encode sufficient information within instrumented simulation executable model 480 to determine which failure bits within register 508 correspond to which instrumentation entities.

The ability to selectively disable monitoring of failure events is of particular use in large batch-simulation environments. Typically, in such an environment, a large number of general purpose computers, running software or hardware simulators, are dedicated to automatically running a large number of simulation runs. If a simulation model with a faulty instrumentation entity that incorrectly indicates failure events is run in such an environment, a large number of erroneous failures will be generated causing lost time. By selectively disabling failure events within instrumentation entities, the present invention allows simulation to continue while only disabling erroneous failure signals rather than having to disable all failure monitoring. This option is particularly useful when the process of correcting a faulty instrumentation entity and creating a new simulation model is substantially time consuming. The present invention also provides similar enabling and disabling structures for the harvest and count events within a model.

Figure 5:
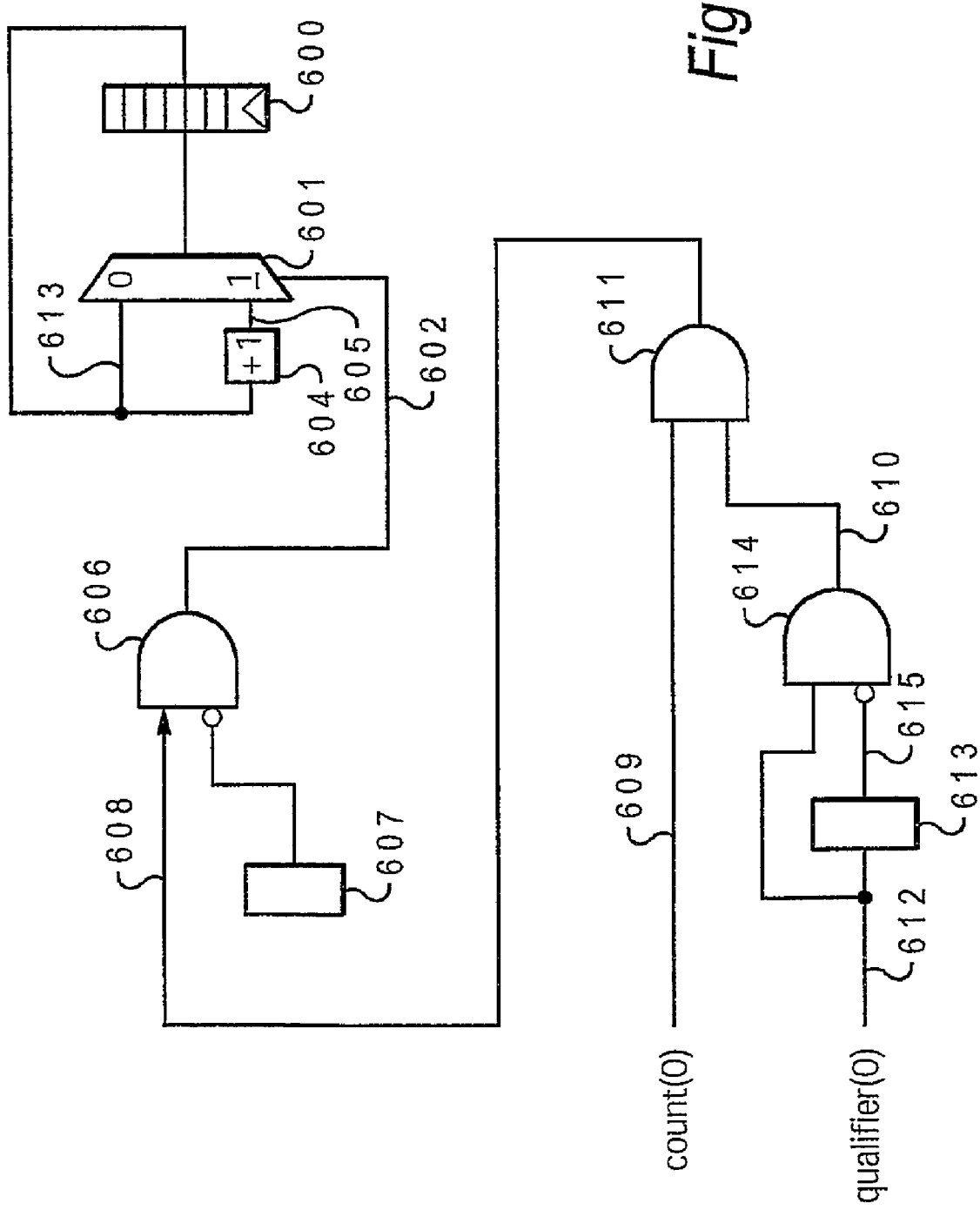
FIG. 5 is a simplified gate level representation of an exemplary counting instrument with a runtime disable feature and automatic clocking adjustment in accordance with the teachings of the present invention.

With reference now to FIG. 5, there is depicted a gate level representation of exemplary logic for one counter of counters 421 within instrumentation logic block 420 depicted in FIG. 3B. Each counter of 421 is represented by a multi-bit simulator latch 600. Simulator latch 600 is initialized by the simulation runtime environment to a value of zero at the beginning of a simulation run. Simulator latch 600 is updated every simulator cycle and is driven by multiplexer 601. Multiplexer 601, controlled by selector signal 602, selects between signal 613, the current value of simulator latch 600, and signal 605, the current value of simulator latch 600 incremented by 1 by incrementer 604, to serve as the next cycle value for simulator latch 600. By selecting signal 605, multiplexer 601 causes the counter value within simulator latch 600 to be incremented when a count event occurs. It should be noted, however, that simulator latch 600 is updated every simulator cycle irrespective of the number of simulator cycles that correspond to a design cycle for the logic being monitored by a counting instrument. Logical AND gate 606 and simulator latch 607 serve to disable the monitoring of count event signal 609 in a manner similar to that described above for the disabling of failure events. Signal 608 is count event signal 609 further qualified by signal 610 by means of logical AND gate 611.

Signal 610 insures that simulator latch 600 will be incremented, if count event signal 609 is active, only once per design cycle for the logic being monitored by a counting instrument irrespective of the number of simulation cycles utilized to model the design cycle. This clocking normalization is necessary to ensure that the event counts recorded in counters 421 correspond directly to the number of design cycles the event occurred in and not the number of simulator cycles the event occurred in. For example if an event occurs in two design cycles where design cycle require four simulators cycles, it is preferable to have the event counter reflect a value of two rather than a value of eight as would occur if the counter were allowed to update in every simulator cycle.

Furthermore, if the count event being monitored is within a portion of the logic with a run-time selectable frequency of operation, it is useful to have the count registers reflect the number of occurrences of the event in terms of design cycles. For example, consider a circumstance where a count event occurs twice during two different simulation runs. In the first run, assume that four simulator cycles are needed to represent each design cycle. Further assume in the second run that twelve simulator cycles are necessary to represent each design cycle. Without a clocking normalization mechanism, the first run would indicate that the event occurred eight times (two occurrences times four simulator cycles per occurrence) and the second run would indicate that the event occurred twenty-four times (two occurrences times twelve simulator cycles per occurrence) when in fact the event actually only occurred twice in both simulation runs. Therefore, it would be advantageous to limit the updating of counters 421 such that each counter is only updated once per design cycle irrespective of the number of simulator cycles, possibly variable at run-time, needed to represent a design cycle.

In simulation models in which multiple simulator cycles are utilized to represent a single design cycle, explicit clocking signals are utilized within the model to control the updating of the various design storage elements. These clocking signals specify in which simulator cycles the simulator latches representing design storage elements are allowed to update. A clocking signal is asserted high for some contiguous number of simulator cycles at either the beginning or end of the design cycle and asserted low for the remaining simulator cycles within the design cycle. If the clocking signal is asserted high during the beginning of the design cycle, the clock is referred to as a "high-active" clock and, likewise, if the clocking signal is asserted low during the beginning of the design cycle, the clock is referred to as a "low-active" clock.

Each count event signal has an associated qualifying signal as specified by counter declaration comments 455 as described above. Typically, these qualifying signals are connected to the clocking signals within the design responsible for updating the storage elements within the portion of logic monitored by the count event. The qualifying signal for the count event for simulator latch 600, qualifying signal 612, is depicted as a high-active qualifier signal. Qualifying signal 612 is processed by simulator latch 613 and logical AND gate 614, to produce signal 610 which is active high for one and only one simulator cycle within the design cycle delineated by qualifying signal 612.

Still referring to FIG. 5, incrementer 604 represents but one possible mechanism that may be utilized to implement the next logic state for a given counter within the present invention. As depicted in FIG. 5, incrementer 604 ensures that counters 421 within a model are cycled through a series of values whose binary patterns correspond to the customary representation of non-negative integers. In one embodiment of the present invention, incrementer 604 is comprised of an adder that increments the current value of counter 600 by a unit value each time signal 605 is selected by selector signal 602. This exemplary implementation provides for convenience of decoding the value of counter 600 at the termination of a simulation run, but does so at a cost in overhead that is not acceptable in many simulators.

For software simulators, one of two basic approaches may be utilized to model an incrementer, such as incrementer 604. In the first approach, the incrementer is modeled directly by an ADD or INCREMENT instruction in the simulation execution model. When incrementers are modeled directly as a single instruction within the simulation execution model, the use of incrementer 604 provides for efficient counters within a simulation execution model.

The present invention discloses a method and system for naming events within a simulation model that prevents name collisions between events in different instrumentation entities, allows for the arbitrary re-use of components of a model in models of arbitrarily increasing size, and furthermore allows for processing designated events in a hierarchical or non-hierarchical manner.

When all instances of an event are considered as a whole without regard to specific instances, the event is considered in a "non-hierarchical" sense. Likewise, when an event is considered with regard to each and every instance, it is considered in a "hierarchical" sense. When considering count events, for example, it is often convenient to track the number of times a particular count event occurred in the aggregate without concern to exactly how many times the count event occurred in each particular instance within a simulation model.

Each type of event (e.g., count, fail, harvest, etc.) is given a separate event namespace by construction. Each event class is therefore an independent group preventing naming collisions between the event types. The data structure of the present invention is independently applied to each of the different event types to ensure correctness within each event class.

In the embodiments illustrated in FIGS. 6A, 6B, 6C, and 6D, the system and method of the present invention are described with respect to count events. One skilled in the art will appreciate and understand the extensions necessary to apply the same techniques to other event classes such as failures or harvests.

With reference to FIG. 6A, there is depicted a block diagram representation of simulation model 1000 containing a number of design and instrumentation entities. As illustrated in FIG. 6A, simulation model 1000 includes two instances of a design entity X, with instance names X1 and X2 respectively.

Within each of design entity instances X1 and X2 is instantiated an instance of an instrumentation entity B3, 1012a and 1012b. Design entity instances X1 and X2 further comprise instances, 1014a and 1014b, respectively, of design entity Z which further contains instances, 1016a and 1016b, of instrumentation entity B1 and instances, 1018a and 1018b, of instrumentation entity B2.

Finally, simulation model 1000 includes an instance of design entity Y, with instance name Y, containing an instance of instrumentation entity B4 1022. Design entity instance Y contains an instance, 1024, of design entity Z with further instances, 1016c and 1018c, of instrumentation entities B1 and B2 respectively.

In what follows the methods of the present invention for uniquely naming events will be considered in the context of exemplary model 1000. It will be assumed in the following description that each instrumentation entity (B1, B2, B3, and B4) has declared a single count event with event name "count1".

In accordance with the method and system of the present invention, the user must uniquely name each type of event (count, fail, or harvest) within a specific instrumentation entity, i.e., the user cannot declare any two events of the same type within the same instrumentation entity with the same event name. Such a constraint does not conflict with the stated goals of the present invention in that a given instrumentation entity is usually created by a specific person at a specific point in time, and maintaining unique names within such a limited circumstance presents only a moderate burden to the user. The data structure disclosed herein does, however, prevent all name collisions between events in different instrumentation entities, and allows for processing the events in a hierarchical and/or non-hierarchical manner.

As previously explained, an HDL naming convention must uniquely identify all the entities within a given design. This constraint is inherent to HDLs and applies to design entities as well as instrumentation entities. In accordance with conventional VHDL entity naming constructs, it is technically possible for two design entities to share the same entity name, entity_name. However, such identically named entities must be encapsulated within a VHDL library from which a valid VHDL model may be constructed. In such a circumstance, entity_name, as it is utilized herein, is equivalent to the VHDL library name concatenated by a period (".") to the entity name as declared in the entity declaration.

Pre-pending a distinct VHDL library name to the entity name disambiguates entities sharing the same entity name. Most HDLs include a mechanism such as this for uniquely naming each design entity. Design entities must be unambiguously named in order to determine which particular entity is called for in any given instance in a simulation model. The present invention employs the prevailing naming mechanism of the native HDL to assign unique entity names for design entities throughout a given model and leverages the uniqueness property of entity names and the uniqueness of each instance's instantiation identifier to create an "extended event identifier" for each event within the simulation model.

Figures 6B, 6C, 6D:
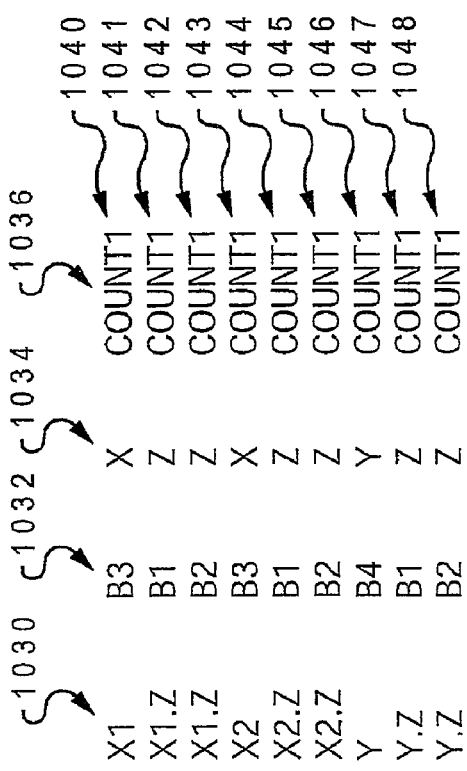
FIG. 6B depicts a data structure for declaring an event within a simulation model in accordance with one embodiment of the present invention.
FIG. 6C illustrates a list of extended event data structures for the simulation model in FIG. 6A.
FIG. 6D depicts a data structure for declaring an event within a simulation model in accordance with an alternate embodiment of the present invention.

With reference to FIG. 6B, there is illustrated a representation of the fields in an extended event identifier data structure, alternatively referred to herein as an "event list", in accordance with one embodiment of the present invention. The extended event identifier begins with instantiation identifier field 1030. This field, as described hereinbefore, is formed of the instance identifiers, proceeding from the top level entity to the direct ancestor of the given instance within the simulation model separated by periods ("."). This string is unique for each and every instance of the event within the model. The extended event identifier further includes an instrumentation entity field 1032, a design entity field 1034, and an eventname field 1036.

Instrumentation entity field 1032 contains the name of the instrumentation entity (or the name assigned to an embedded instrumentation entity) that generates the simulation event. Design entity field 1034 contains the entity name of the design entity in which the event occurs. Eventname field 1036 is the name given to the event in the instrumentation entity description comments of an instrumentation entity or the event name assigned to an event within an embedded instrumentation entity. These four namespace fields comprise a unique identifier for each event within a simulation model that allows for the re-use of components within other models without risk of name collisions and the consideration of events in a hierarchical or non-hierarchical sense.

With reference now to FIG. 6C, there is shown a list of extended event identifiers for model 1000. Event identifiers 1040, 1041, 1042, 1043, 1044, 1045, 1046, 1047, and 1048 are declared within simulation model 1000 to designate count events having eventname "count1". The extended event identification procedure of the present invention will be described in the context of these extended event identifiers.

The uniqueness of the names in design entity name field 1034 is a primary distinguishing factor between events. By including the design entity name in the extended event identifier, each design entity is, in effect, given a unique namespace for the events associated with that design entity, i.e., events within a given design entity cannot have name collisions with events associated with other design entities.

It is still possible however, to have name collisions between events defined by different instrumentation entities that are incorporated within a single design entity. Events 1041 and 1042, for example, if identified solely by the design entity name, have a name collision. Both are events with eventname "count1" within design entity Z, and if labeled as such, are indistinguishable. In order to alleviate a naming collision between events 1041 and 1042, the present invention employs instrumentation entity field 1032. By referencing the design entity and instrumentation entity names, both of which are unique with respect to themselves and each other, a unique event namespace is created for each instrumentation entity associated with any given design entity. For example, event identifier 1041 and 1042 would be in conflict (both named Z.count1), unless the respective instrumentation entity names are included within the extended event identifier to produce names B1.Z.count1 and B2.Z.count1 for these events.

It should be noted that it is possible to uniquely name each event by using instrumentation entity name field 1032 alone. Due to the uniqueness property of instrumentation entity names, event names that are only named by the instrumentation entity name and the event name field will be necessarily unique.

However, such a naming scheme is insufficient for associating events with a given design entity. In practice, it is desirable to associate events with the design entity in which they occur rather than associating them with the potentially numerous instrumentation entities that are utilized to track them. Moreover, referencing the appropriate design entity within the eventname allows all the events associated with a given design entity to be centrally referenced without the need to ascertain the names of all the instrumentation entities associated with the given design entity. The data structure of the present invention utilizes both the instrumentation entity and design entity names in naming events for ease of reference at the cost of moderate uniqueness redundancy in the event names.

In an alternative embodiment of the present invention, the instrumentation entityname is not included within the extended event identifier. Referring to FIG. 6D, such an alternative extended event identification data structure is depicted. As shown in FIG. 6D, events are named by instantiation identifier field 1030, design entity name field 1034, and event name field 1036.

Such a data structure provides name collision protection between design entities but not within design entities. That is, the user must ensure that events names for events associated with a given design entity do not collide. In case of user error in this regard, model build tools may be utilized to detect an event name collision condition during model compilation. The alternative data structure depicted in FIG. 6D provides for simpler naming and referencing of events at the expense of requiring the user to prevent name collisions for events associated with a given design entity.

Returning to FIG. 6B, the combination of instrumentation entity field 1032, design entity name field 1034, and event-name field 1036 for a given event, provides a unique identifier for any given event without regard to multiple instantiations of the event. In order to uniquely distinguish between multiple instantiations of an event, instantiation identifier field 1030 is included in the extended event identifier. Instantiation identifier field 1030 field, by its construction, provides a unique string for any instance of an entity within any simulation model.

When evaluating occurrences of an event in a non-hierarchical sense, instantiation identifier field 1030 is ignored while searching for matching events. As illustrated in FIG. 6C, for example, a non-hierarchical query for the number of time a "count1" event occurs within design entity Z as detected by instrumentation entity B1, utilizes the following list of count eventnames:

| X1.Z | B1 | Z | COUNT1 |
| X2.Z | B1 | Z | COUNT1 |
| Y.Z  | B1 | Z | COUNT1. |

These count events are added together to form an aggregate count of the total number of time the specific event occurred within the simulation model.

A hierarchical query includes specific criteria to match against the hierarchy field to limit the counter or counters found to specific instances of the requested event. For example, a query to obtain the count1 event of instrumentation entity B1 within the X1.Z instance of design entity Z utilizes the following count eventname:

X1.Z B1 Z COUNT1, which represents the number of times the count1 event was counted by instrumentation entity B1 within design entity instance X1.Z for a particular simulation interval.

By providing matching model hierarchy criteria against instantiation identifier field 1030, it is possible to consider the events with respect to their particular instance or instances within the model, i.e., a hierarchical query. A non-hierarchical query merely ignores the hierarchy field and returns all the instances of the requested events within the model.

Figure 7A:
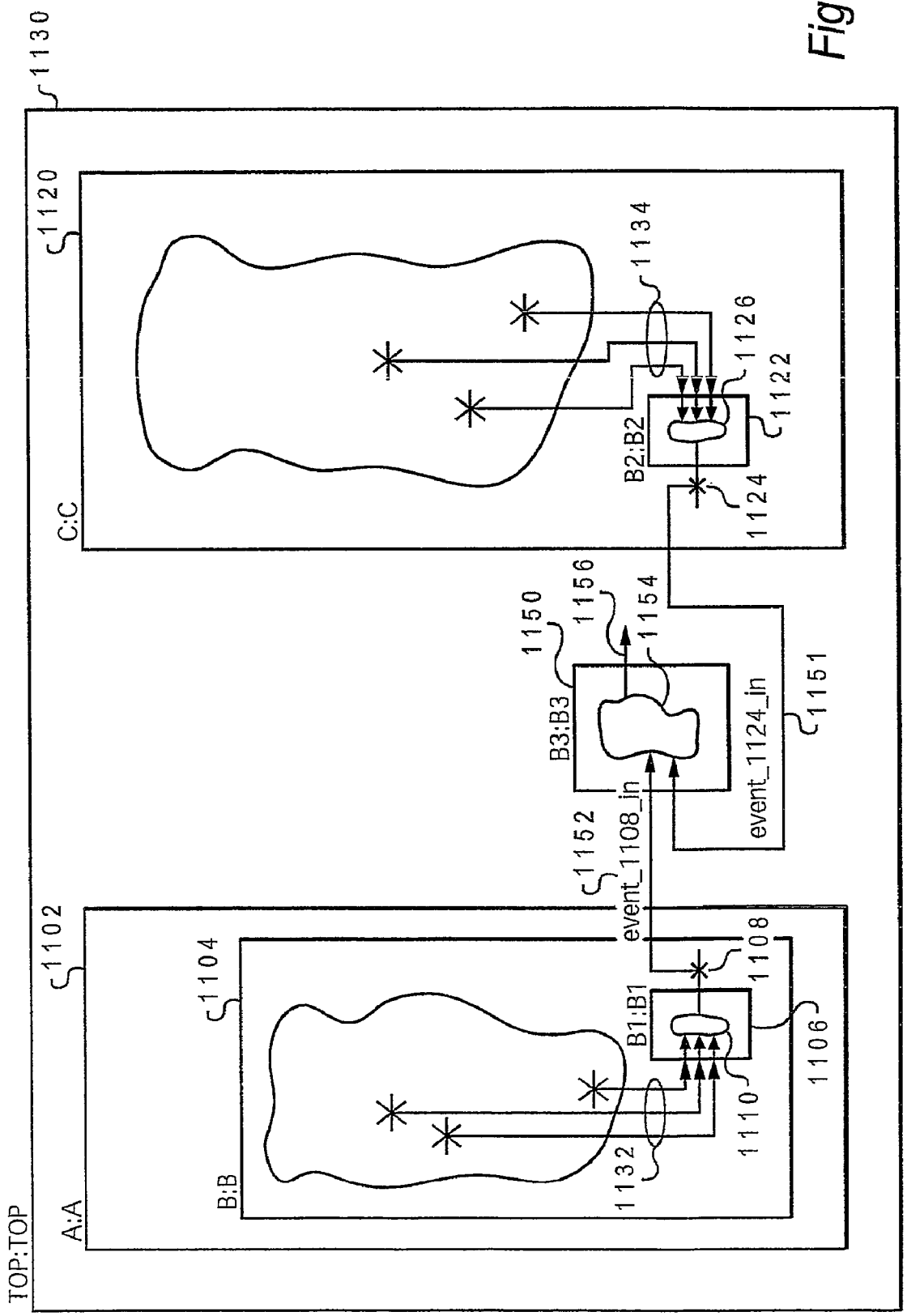
FIG. 7A is a block diagram illustrating a simulation model in which the hierarchical event processing of the present invention is applicable.

With reference to FIG. 7A, there is depicted a block diagram illustrating a simulation model 1100 in which the hierarchical event processing of the present invention is applicable. Simulation model 1100 comprises a top-level design entity 1130 in which a pair of lower-level design entities 1102 and 1120 is instantiated. A design entity 1104 containing instrumentation entity 1106 is included within design entity 1102. As illustrated in FIG. 7A, instrumentation entity 1106 includes logic 1110 for generating a simulation event 1108 from signal set 1132 from within design entity 1104. Design entity 1120 includes an instrumentation entity 1122 that generates a simulation event 1124 using signal set 1134.

Utilizing the techniques described hereinbefore, generating a hierarchical event that is some logical combination of events 1108 and 1124 requires the creation of an instrumentation entity associated with top level design entity 1130 that references signal sets 1132 and 1134. Conventionally, such an instrumentation entity would substantially reproduce instrumentation logic 1110 and 1126 to process signal sets 1132 and 1134, respectively, thus producing a copy of events 1108 and 1124. Such a procedure is inefficient and prone to error. If, for example, changes are made to any or all of signal sets 1132 and 1134, or instrumentation logic 1110 and 1126, these changes would have to be accurately repeated in the instrumentation entity logic for the combined event.

The present invention provides a mechanism whereby events, such as events 1108 and 1124, are directly referenced and utilized as inputs to cross-hierarchical instrumentation entities. In this manner, signal connections 1132 and 1134, as well as instrumentation logic 1110 and 1126, are directly re-utilized to produce the desired hierarchical event.

To facilitate direct referencing of events within simulation models, a specialized data structure is implemented within instrumentation entity input port map comment syntax. This data structure directly connects input ports of instrumentation entities to cross-hierarchical events within a simulation model.

For the embodiment depicted in FIG. 7A, an instrumentation entity 1150 is instantiated within top-level design entity 1130 to generate a hierarchical event 1156 that is some function of events 1108 and 1124. As illustrated in FIG. 7A, instrumentation entity 1150 includes a pair of inputs 1151 and 1152 that are directly connected to events 1124 and 1108, respectively, utilizing the augmented syntax described below. These input connections are logically combined using instrumentation logic 1154 to produce a cross-hierarchical event 1156.

With reference to FIG. 7B, there is depicted a set of input port mapping comments for performing cross-hierarchical processing of simulation model events in accordance with the teachings of the present invention. In what follows, it is assumed that events 1108 and 1124 are count events with event names event_1108 and event_1124, respectively, and that these events are connected to input ports event_1108_in and event_1124_in on instrumentation entity 1150. As depicted in FIG. 7B, a first input port mapping comment 1161 contains data for referencing event 1108 to input port event_1108_in. A second input port mapping comment 1162 contains data for referencing event 1124 to input port event_1124_in. It should be noted that each of input port mapping comments 1161 and 1162 includes a pre-pended non-conventional comment identifier, --!!, that is utilized by the HDL compiler (such as compiler 462 in FIG. 3D) to maintain the port mapping comments separate from the design.

To facilitate connection of a simulation event to an instrumentation entity input port, input port mapping comments 1161 and 1162 includes two distinct parts: an instance identifier and an event identifier. The instance identifier is a string built from instance names (in descending hierarchical order) of all design entities between and including the design entity containing the instrumentation entity of the cross-hierarchical event being defined (i.e., the highest level design entity for the cross-hierarchical event), and the design entity in which the event that is utilized in generating the cross-hierarchical event. If the design entity containing the hierarchical event is the same as the design entity containing the event to be connected to, the instance identifier is a null string. A pair of instance identifiers 1163 and 1164, within input port mapping comments 1161 and 1162, respectively, specify that events 1108 and 1124 originate from signals within design entity 1104 and 1120, respectively.

Input port mapping comments 1161 and 1162 further include event identifiers 1165 and 1166, which identify input simulation events in terms of local instrumentation entities 1106 and 1122, respectively. In accordance with the embodiment depicted in FIG. 7B, each event identifier is a string beginning with an open bracket ("[") character and ending with a closed bracket ("]") character. Between these brackets, three sub-strings, delineated by period (".") characters, comprise a data structure utilized to identify a specific event from which the cross-hierarchical event is defined. The first sub-string within an event identifier is the instance name of the instrumentation entity containing the event. The second sub-string is a string specifying the type of the event (e.g., "count", "fail", or "harvest"). Finally, the third sub-string is the event name of the given event as specified in the declaration comment for the event. Each event identifier string uniquely identifies a single event within a given design entity. As depicted in FIG. 7B, event identifier strings 1165 and 1166 identify events 1108 and 1124, respectively.

In accordance with an alternate embodiment of the present invention, the event identifier naming structure is modified slightly for events that are labeled in accordance with FIG. 6D (event names that do not include the instrumentation entity name). When an instrumentation identifier is absent from the extended event identifier, the event identifier string with an input port mapping comment includes two sub-strings: a string denoting the type of event to connect to; and a string providing the name of the event separated by a period (".") character. The instrumentation entity name is not required in this case since all events of a given type associated with a given design entity will have unique names. The model build tools of the present invention will automatically search all instrumentation entities associated with the design entity called out by the instance identifier to determine which instrumentation entity generates an event having the name and type provided in the event identifier string.

Referring to FIG. 7C, there is illustrated a set of data structures for performing hierarchical processing of simulation model events in accordance with a second embodiment of the present invention. In the depicted embodiment, a pair of input port mapping comments 1171 and 1172 employs a syntax compatible with the event naming data structure depicted in FIG. 6D.

Input port mapping comment 1171 connects event 1108 to input port event_1108_in on instrumentation entity 1150. Likewise, input port mapping comment 1172 connects event 1124 to input port event_1124_in on instrumentation entity 1150. By utilizing the augmented syntax of FIG. 7B or FIG. 7C, it is possible to create hierarchical events by connecting the inputs of instrumentation entities to events within the simulation model.

The above described system and method provides for practical instrumentation of simulation models and allows for efficient implementation of instrumentation logic through embedded instrumentation entities. Embedded instrumentation entities, as described hereinabove, are however necessarily limited to task-specific implementations. As described with reference to FIGS. 8A and 8B, the present invention further provides for a more flexible implementation of instrumentation logic in a more unstructured manner.

Figure 8A:
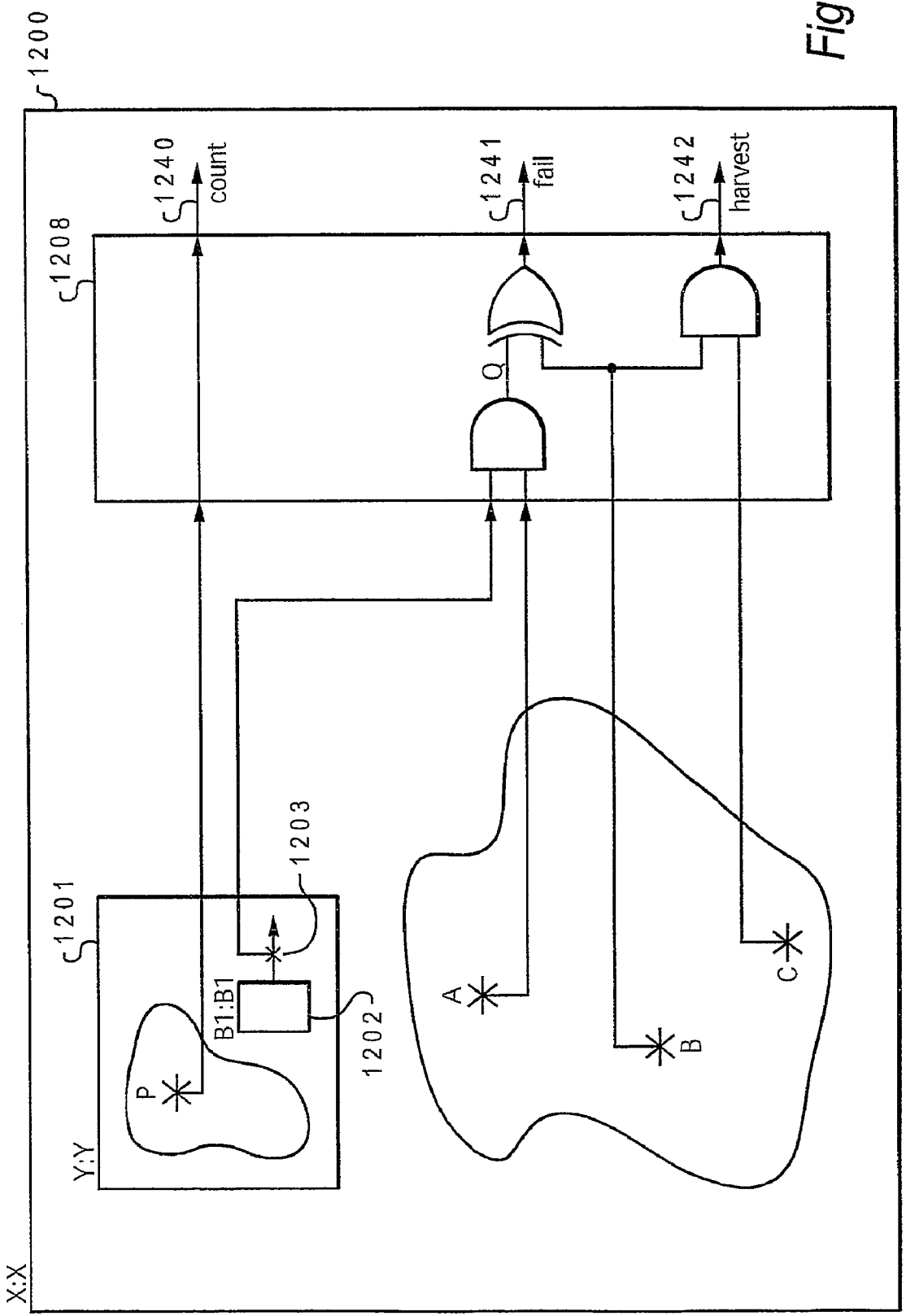
FIG. 8A depicts a representative target design entity with an instrumentation entity containing random instrumentation logic implemented in accordance with the teachings of the present invention.

It is often necessary to tailor instrumentation logic to address unique problems and circumstances. Instrumentation logic of a specific and yet non-predefined nature that is designed in accordance with the techniques disclosed herein with reference to FIGS. 8A and 8B is referred herein as "random instrumentation logic." A data construct including general logic primitives (Boolean operators, storage elements, etc.) and an interconnection method for these primitives is utilized for implementing such random instrumentation logic.

For instrumenting a simulation model as described heretofore, an HDL such as VHDL or Verilog is utilized as a platform from which instrumentation logic is generated. Appropriate instrumentation entity descriptor comments within design entity source code files couple the resultant instrumentation entities to designated target design entities within a simulation model.

In addition to entity descriptor comments within a design entity source code file, the foregoing instrumentation technique requires a separate HDL file in which the instrumentation entity is described. As explained with reference to FIGS. 8A and 8B, the present invention provides a method, system, and data structure for instrumenting design entities within a simulation model while avoiding the design process overhead required for creating a separate instrumentation entity HDL file.

In accordance with the teachings of the present invention, random instrumentation logic is directly deployed within target design entities in terms of individualized and customizable instrumentation descriptor comments. Such instrumentation descriptor comments are encoded within the target design entity HDL source code file and provide a means for the describing random instrumentation logic, events, and interconnections between the created instrumentation logic and the target design entity. The random instrumentation logic is inserted into the simulation model in a manner similar to the techniques used for embedded instrumentation entities to produce an instrumentation entity without the need for the creation of an explicit HDL instrumentation entity file.

With reference to FIG. 8A, there is illustrated a representative target design entity 1200 wherein random instrumentation logic is implemented in accordance with a preferred embodiment of the present invention. Instantiated within target design entity 1200 is a design entity 1201. As further depicted in FIG. 8A, an instrumentation entity 1202 is instantiated within design entity 1201. Instrumentation entity 1202 is designed in accordance with the principles set forth hereinabove to generate a count event 1203 having an event name "count1." Target design entity 1200 further includes an instrumentation entity 1208 that is generated utilizing random instrumentation logic. As depicted in FIG. 8A, instrumentation entity 1208 receives as inputs signals P, A, B, and C along with count event 1203.

Instrumentation entity 1208 is constructed by a set of unconventional comments lines within the source code file for target design entity 1200. These comments may be incorporated at any point within the logic description section of the HDL source code file. HDL compiler 462 (FIG. 3B) recognizes the unconventional comments in addition to any comments utilized to instantiate embedded instrumentation entities within design entity 1200. During the post-compilation/model build phase, instrumentation load tool 464 processes these comments in a manner similar to that utilized for embedded instrumentation entities (described with reference to FIGS. 6A-6D) to generate instrumentation entity 1208.

A variety of possible syntaxes can be utilized to formulate the unconventional HDL comments required for generating random instrumentation logic within the source code file of a target design entity. As depicted in FIG. 8B, much of the syntax of these comments employs syntax similar to the concurrent subset of the VHDL language with the addition of syntactic and semantic enhancements that provide a means of connection between an instrumentation entity and its target design entity. In addition, minor syntactic and semantic enhancements are provided to declare events and intermediate signals.

With reference now to FIG. 8B, there is illustrated an exemplary HDL source code file 1220 that describes design entity 1200. Within HDL source code file 1220, an entity instantiation 1221 produces design entity 1201, and assignment statements 1222 are utilized to generate signals A, B, and C. A set of unconventional comments 1223 within HDL source code file 1220 is utilized to produce instrumentation entity 1208. Comments 1223 are formulated as left-hand side (l.h.s.)/right-hand side (r.h.s.) assignment statements of the form:

{l.h.s.}<={r.h.s.};

where {l.h.s.}, referred to herein after as lhs, is the assignment statement target and, {r.h.s}, referred to herein after as rhs is an expression denoting the logical value to be assigned to the statement lhs. A number of rules delineate the possible expressions for lhs and rhs in any legal statement in the instrumentation comments.

As employed within the instrumentation data structure of the present invention, an lhs statement may be either an event declaration or the name of a signal that is instantiated within an instrumentation entity. An event declaration is an expression with in bracket characters ("[A,A]") that generates a new event. Within comments 1223, a statement 1230 produces a count event 1240 from instrumentation entity 1208 (FIG. 8A) having eventname "countname0".

Within an lhs event declaration, a first field designates the event type (count, fail, harvest, etc.) and is followed by such other fields as are necessary to declare the event. As illustrated in lines 1230, 1234, and 1236, such event declaration fields follow the same format as the event declaration fields depicted in FIG. 3C.

Comments 1223 further include a line 1232 having an lhs that declares a signal Q within instrumentation entity 1208. To prevent ambiguity, any signal declared in this manner may not have a name corresponding to the name of any signal present on the top level of target design entity 1200. Conformance to this requirement is verified by instrumentation load tool 464 (FIG. 3D) during processing. Signals declared by an lhs expression may be incorporated within an rhs expression as shown in lines 1232 and 1234.

An rhs includes logical connectivity expressions and/or functions that combine various signals. Signals within these connectivity expressions may originate from a number of possible sources including: signals declared on the lhs of a statement in the instrumentation comments; signals within the target design entity; or signals designating other events within the target design entity.

The absence of period (".") or bracket ("[","]") characters within a signal value description in the rhs of a statement, designates the object signal as corresponding to either a signal within the top hierarchical level of the target design entity or to a signal declared on the lhs of a statement within the instrumentation language. Signals are named in a mutually exclusive manner by the rules governing creation of signals on the lhs of a statement in the instrumentation comments, thereby preventing any ambiguity in the determining the source of the given signal.

Signals in rhs connectivity expressions can also be connections to signals within entities instantiated within the target design entity. In such a circumstance, the instance names of the entity or entities in the hierarchy enclosing the desired signal are placed before the signal name in hierarchy order, delineated by period (".") characters. For example, the signal in statement 1230 ("Y.P") represents signal 1204 within design entity 1201. Signals at any level of the target design hierarchy are thus accessible to instrumentation logic generated by the instrumentation language comments.

Signals within the instrumentation comment expressions can also designate other events within the target entity. Event identifiers as described hereinbefore for hierarchical events are used to denote such "event" signals. For example, statement 1232 performs a logical AND of instrumentation event 1203 and signal A. The event identifier "Y.[B1.count.count1]" connects instrumentation entity 1208 to instrumentation event 1203. This notation permits instrumentation events at any level of design hierarchy within target design entity 1200 to be directly accessed.

As further depicted in FIG. 8B, statement 1232 produces intermediate signal Q within instrumentation entity 1208. This is an example of an instrumentation comment statement declaring a new intermediate signal. These signals can be used in other statements to construct random instrumentation logic of any desired depth or complexity.

Statement 1234 utilizes intermediate signal Q along with signal 1206 to produce fail event 1241. The syntax for fail event declaration includes a field denoting the type of event ("fail"), a field giving the event name for the fail event ("failname0"), and a final field denoting the message to associate with the fail. Finally, statement 1236 produces harvest event 1242.

In general, the rhs expression of any statement in the instrumentation data structure of the present invention can access any signal or instrumentation event signal within the target design entity utilizing these syntactic mechanisms. These signals can be combined to form new events or intermediate signals that can themselves be further combined to form instrumentation logic of any desired depth or complexity.

Instrumentation comments can be placed anywhere within the logic description section of the target entity source code file. All instrumentation comments within a file are considered as a whole and produce a single instrumentation entity within the target design entity.

It is often necessary to override signal values within a simulation model to test various functions and create certain conditions that would otherwise not be possible or simple to obtain. To provide an efficient and designer accessible means of overriding signal values within a simulation model, the present invention incorporates specialized signal override output ports and logic into instrumentation entities that permit bus signal overrides during model simulation. Such signal override output ports must have different names that the outputs for count, fail, and harvest events, and compliance with this condition is verified by instrumentation load tool 464 (FIG. 4D) during the model build process.

The signal override output ports may be declared explicitly as ports in the HDL source code file of an explicitly represented instrumentation entity. For an embedded instrumentation entity or instrumentation entities produced by random instrumentation logic comments within a target design entity, the signal override output ports are automatically generated by instrumentation load tool 464. The signal override output ports are described in output port map statements that declare an alternate value that overrides a given simulation signal. Such an output port map statement further declares the conditions under which the simulation signal will be overridden. For each simulation signal (single or multi-bit) to be overridden, two output signals are produced: one providing the override signal value and another in the form of a single bit signal that enables or disables overriding of the simulation signal.

Figure 9A:
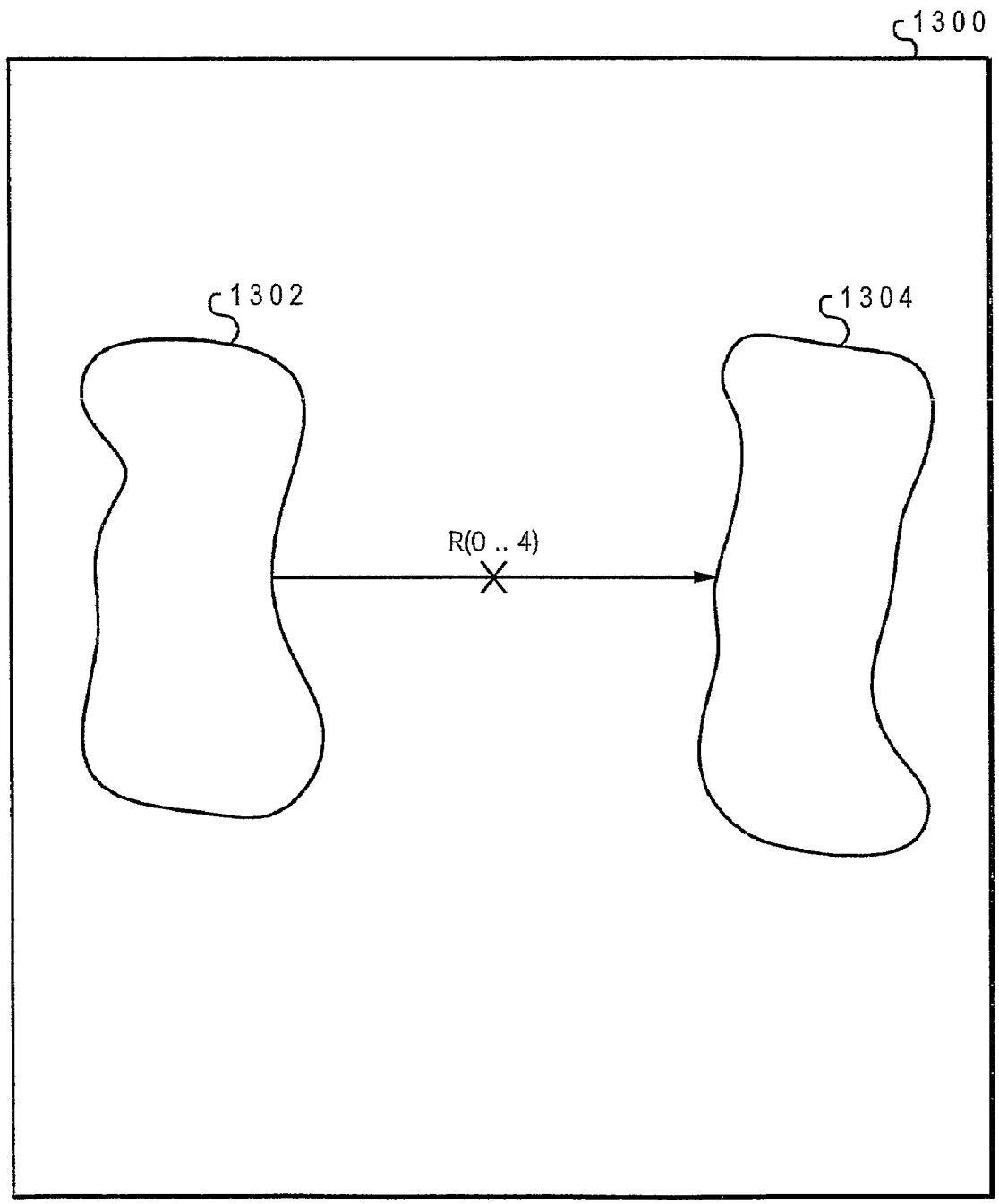
FIG. 9A depicts an exemplary design entity containing a multi-bit simulation signal.

With reference to FIG. 9A, there is depicted an exemplary HDL design entity 1300 containing a multi-bit simulation signal R. Simulation signal R is driven by one or more sources within a logic module 1302, and is received by one or more sinks within a logic module 1304. While the present invention will be described with respect to overriding signal R, one skilled in the art will understand and appreciate the extensions necessary to apply the principles set forth herein to overriding single bit signals or subsets of multi-bit signals.

Figure 9B:
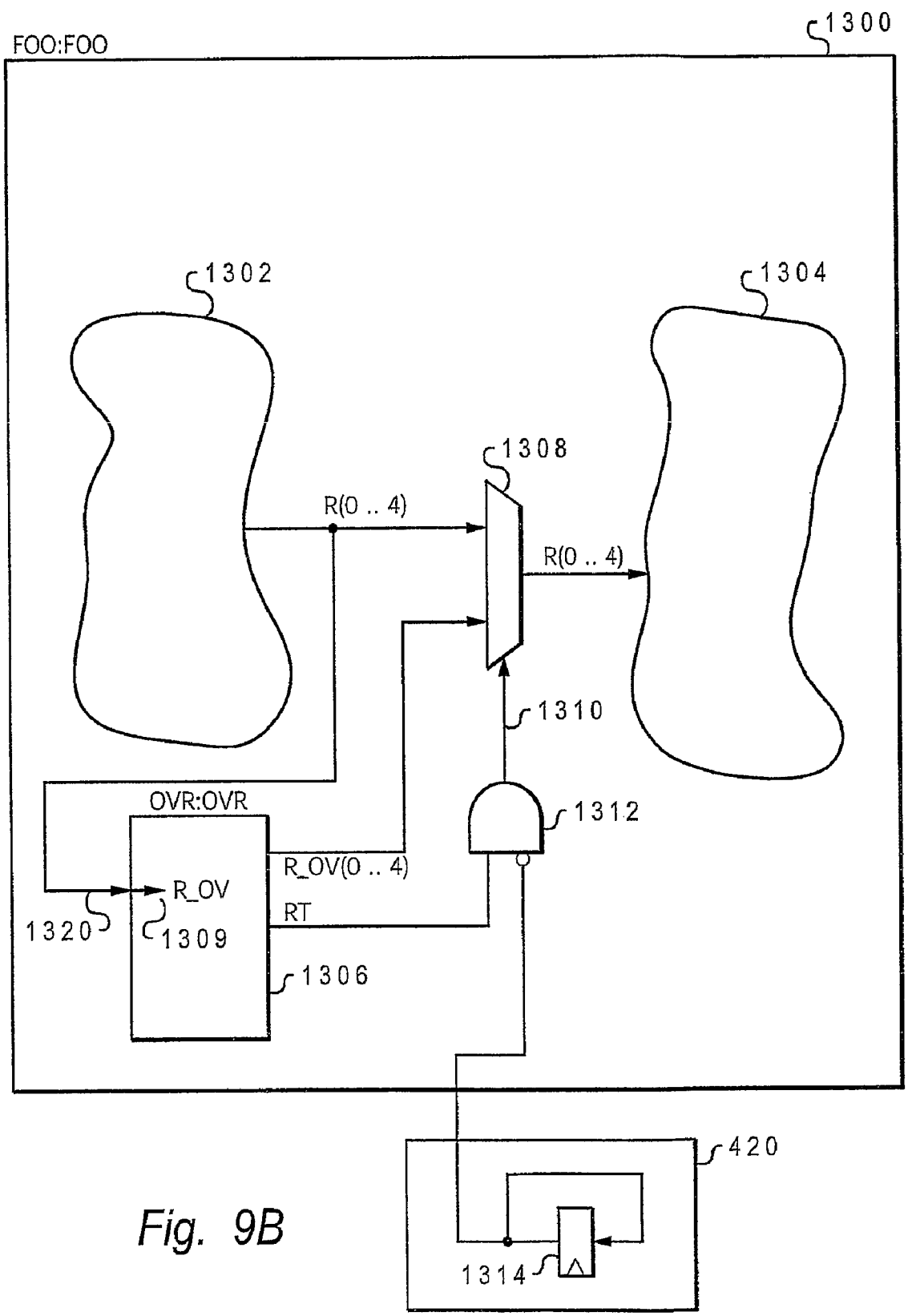
FIG. 9B illustrates a design entity wherein signal injection is implemented in accordance with the teachings of the present invention.

Referring to FIG. 9B, signal override functionality is incorporated within design entity 1300. As illustrated in FIG. 9B, design entity 1300 includes an instrumentation entity 1306 that is equipped to override signal R. In the depicted embodiment, instrumentation entity 1306 produces a signal R_OV(0 . . . 4) that is utilized within HDL design entity 1300 to selectively replace signal R as an input into logic module 1304. Instrumentation entity 1306 further produces a signal RT that enables an override of signal R with signal R_OV(0 . . . 4).

During a model build process, instrumentation load tool 464, instantiates a multiplexer (MUX) 1308 that breaks the path of the original signal R as depicted in FIG. 9A to produce signal R' that is input into logic module 1304. MUX 1308 is directly instantiated by instrumentation load tool 464 into the design proto data structure for instrumentation entity 1306 without the need to alter the HDL source code for HDL design entity 1300. MUX 1308 selects between override signal R_OV(0 . . . 4) and the original signal value R to determine the value of signal R'.

MUX 1308 is controlled by a select signal 1310 that is driven by logical AND gate 1312. Logical AND gate 1312 is driven by signal RT and a latch bit signal from a latch 1314. In a manner similar to that described in relation fail events in FIG. 5A, latch 1314, when loaded with a binary >1' value, forces MUX 1308 to select the original signal value R, thereby disabling overrides of signal R.

Instrumentation load tool 464 generates latch 1314 and logical AND gate 1312 for every overridable signal within the simulation model. All signal overrides within a model can thus be selectively and individually disabled. For each overridable signal, latch 1314 resides within instrumentation logic block 420 as depicted in FIG. 4B. In accordance with a preferred embodiment, only one instrumentation entity may override a given single bit signal or any signal or subset of signals within a multi-bit signal.

The signal override system of the present invention further provides a means by which instrumentation entities may access the original unaltered version of any given signal within the simulation model. As depicted in FIG. 9B, for example, instrumentation entity 1306 accesses the unaltered signal R by means of input signal 1320.

With reference to FIG. 9C, there is illustrated an exemplary HDL source code file 1340 that describes instrumentation entity 1306. HDL source code file 1340 includes entity descriptor comments 1351 and an architecture section 1358 comprising the functional logic within instrumentation entity 1306.

Within HDL source code file 1340, an input port map statement 1364 declares an input port 1309 at which instrumentation entity 1306 receives signal R from logic module 1302. A set of output port map statements 1362 and 1363 define the output ports from instrumentation entity 1306 for signals R_OV(0 . . . 4) and RT, respectively.

An input port map comment 1360 connects signal input 1320 to instrumentation entity 1306. Input port map comment 1360 employs an augmented syntax from that previously described for input port map comments. Signals that appear within brace ("{", "}") characters are defined to reference the original unaltered version of a signal within a particular target design entity. Hence the statement --!! R_IN(0 to 4)=>{R(0 to 4)} connects input port R_IN to signal R in the altered design proto data structure. The brace syntax may be used to enclose any signal within a port map comment or any signal referred to within a random instrumentation comment statement RHS. If a signal referenced within braces has no associated override mechanism in the model, the signal declaration within braces merely resolves to the unaltered signal itself.

An additional comment section, output declarations 1361, is further included within the descriptor comment syntax to declare signal overrides. Output declaration comment 1361 serves to generate the override logic shown in FIG. 9B and connect signals RT and R_OV(0 . . . 4) to the override logic. Output declarations such as output declaration comment 1361 are of the form:

--!!<name>: out_port=>target_signal [ctrl_port];

where name is a name associated with the specific signal override (R_OVRRIDE in FIG. 9C), out_port is the output port providing the override value for the signal, target_signal is the name of the signal to be overridden, and ctrl_port is the single bit output port that determines when the target signal is overridden.

One such output declaration is required for every overridable signal. Signals designated by out_port and ctrl_port must appear as outputs declared in the HDL port map for the entity. As it does for instrumentation entities, instrumentation load tool 464 parses the comments depicted in FIG. 9C and alters the proto data structures within the simulation model at model build time to produce a result such as that depicted in FIG. 9B.

Furthermore, each signal override is given a unique name based on the "name" field within the output declaration comment in a manner analogous to that described earlier for count events. In this manner, each signal override can be specifically referred to for such purposes as disabling the signal override by setting latch 1314 as shown in FIG. 9B.

While FIG. 9C illustrates only those constructs necessary for implementing a signal override, it should be noted that there is no limitation placed upon the creation of count, fail, and harvest events within the same instrumentation entity as a signal override, and furthermore, that multiple signal override entities may be incorporated within the same instrumentation entity.

Referring to FIG. 9D, there is depicted an HDL source code file for producing design entity 1300 wherein a set of random instrumentation comments 1380 implement the logic necessary for selectively overriding signal R. A comment 1381 connects the unaltered version of signal R (referred to within the braces ("{", "}") syntax) to an internal instrumentation signal R_IN. A pair of comments 1382 and 1383 assigns values for signals R_OV and RT (the exact expressions assigned to RT and R_OV are not depicted). An event declaration instrumentation comment 1384 produces a signal that enables signal R to be overridden. In accordance with the depicted embodiment, an event declaration comment is of the form:

[override, <name>, <target_signal>, <ctrl_signal>], where override is a fixed string denoting a signal override, "<name>" is the name assigned to the override, "<target_signal>" is the name of the signal in the target entity to be altered, and "<ctrl_signal>" is the name of the signal that determines when the signal override takes effect. By utilizing random instrumentation comments, a design engineer can efficiently create signal overrides.

Since in accordance with the teachings of the present invention, signal overrides are implemented directly using hardware constructs, it is possible to efficiently utilize signal overrides within a hardware simulator.

In the foregoing description, functional signals within a design entity that are referenced by instrumentation generally reside within the target design entity to which the instrumentation entity or random instrumentation logic is attached or within the target design entity's descendent entity or entities. Such signal references can occur, for example, in the input port map 453 of the HDL file 440 that describes an instrumentation entity (as described above with reference to FIG. 3C) or the right hand side (rhs) of statement defining random instrumentation logic (as described above with reference to FIG. 8B). Similarly, instrumentation events referenced by instrumentation logic generally reside within the target design entity to which the instrumentation entity or random instrumentation logic is attached or within its descendent entity or entities, as described above with reference to FIGS. 7A-7C and 8B.

The practice of referring to signal or event names within the target design entity and/or its descendants (which can be referred to as the "scope" of the target design entity) can further be enforced, if desired, by instrumentation load tool 464 during the model build process shown in FIG. 3D. One rationale for enforcing a "scope" rule during the model build process is that if all signal and event references are confined to the scope of the target design entity, the signal(s) and/or event(s) referenced will generally (with some exceptions) be present in the simulation model. If, however, references outside of the scope of the target design entity are permitted, at least some references may refer to signals or instrumentation events that are not present within the given simulation model.

For example, referring again to FIG. 3B, assume a designer of design entity B 326 wants to create an instrumentation event that requires reference to signal Q 372, signal S 374, and signal R 376. If signal and event references are limited to the scope of the target design entity, then the random instrumentation logic or instrumentation entity referencing signal Q 372, signal S 374, and signal R 376 must be contained within or otherwise referenced by or attached to the HDL file for FXU design entity 321 or TOP design entity 329 (i.e., a level of the design hierarchy that encloses all the necessary signals). However, this requirement may be inconvenient because in many cases the "owner" controlling the content and functionality of design entity B 326 during the design process may not be the owner of the higher level design entities (e.g., FXU or TOP). Further, the requirement may necessitate the separation of instrumentation code describing logically related instrumentation into different HDL files, increasing the difficulty of managing the instrumentation code. Thus, in at least some embodiments, it is desirable to permit instrumentation to reference signals and/or events outside of the scope of an associated target design entity.

One exemplary syntax that permits out-of-scope references to signals and/or instrumentation events can be given for signal Q 372, signal S 374, and signal R 376 with reference to the scope of design entity B 326 as follows:

| | |
|---|---|
| S | // Refers to signal S 374 (since it is at the hierarchy level of design // entity B 326) |
| !.R | // Refers to signal R 376 in design entity FXU 321, where "!" // indicates moving up one level of the design hierarchy from the // scope of the target design entity |
| !.A.Q | // Refers to signal Q 372 within design entity A 325 |

Similarly, signal T 373 can be referenced from the scope of design entity B 326 as follows: !.!.FPU.T. The same syntax can be utilized for event references outside the scope of the target design entity, except that the signal name is replaced with an event reference. Of course, although the "!" character has been utilized in the exemplary syntax to indicate moving up one level of the design hierarchy, in other embodiments of the syntax an alternative character or string can be utilized.

As noted above, if out-of-scope references are permitted during the model build process, there are some situations in which signal and instrumentation event references cannot be resolved within the simulation model. For example, in a simulation model including only design entity B 326, any of the out-of-scope references will fail to find the referenced signals or instrumentation events because, for that simulation model, the higher hierarchy levels simply do not exist. In a preferred embodiment, identifying a referenced signal or instrumentation event that cannot be resolved due to an out-of-scope reference is not flagged as an error, but entails special handling to eliminate from the instrumented simulation model any instrumentation logic that depends on a signal or instrumentation event reference that failed to resolve.

It should also be noted that, in certain cases, even in-scope event and signal references may fail to resolve. For example, VHDL supports definition of multiple alternative architectures for an entity and the use of a VHDL configuration to specify which of the multiple architectures is to be used for the entity. A VHDL configuration can also be used to replace one entity with another entity or OPEN an entity to leave it empty.

If a design entity is OPEN any reference to a signal supposed to be within the design entity will obviously fail to resolve. As above, this situation is not considered an error, and any instrumentation logic that depends on an unresolved signal reference must be eliminated from the simulation model. If, however, a signal reference resolves for one or more architectures of a design entity and fails to resolve for at least one other architecture of the design entity, it may be desirable to flag this situation as an error in at least some cases, depending, for example, upon the designer's preference.

Again assuming the scope of design entity B 326 of FIG. 3B, an exemplary syntax for expressing that it is permissible for a reference to signal T 373 to fail to resolve without error is given as follows:

!.!.FPU0.T#

This syntax may also be applied to event references. For example, assuming a scope of design entity C 1120 in the exemplary simulation model depicted in FIG. 7A, a reference to count event 1108 can be designated as able to fail without error utilizing the following statement:

!.A.B.[count.event_1108]#

In this exemplary syntax, the # character is placed adjacent to (i.e., without an intervening white space) a signal or event reference to identify that signal or instrumentation event as able to fail to resolve without error. In this exemplary syntax, any signal or event that is not so designated will generate an error during the model build process of FIG. 3D if it fails to resolve. In at least some embodiments, this syntax can be extended to permit the designer to explicitly define a set of one or more architectures for which a failure to resolve will cause an error and/or a set of one or more architectures for which a failure to resolve will not cause an error.

Figure 10A:
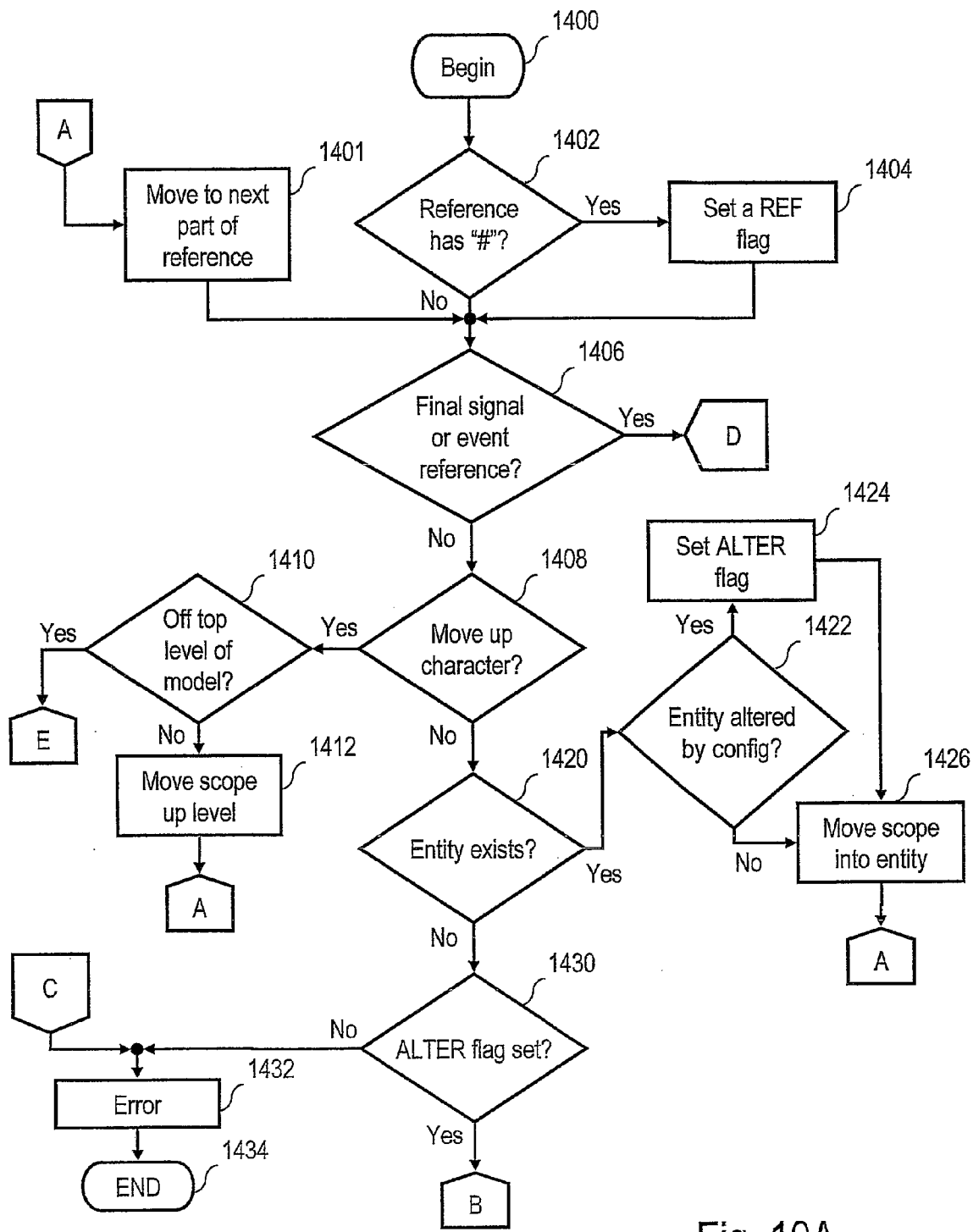
FIGS. 10A-10B together form a high level logical flowchart of a process by which random instrumentation logic and/or instrumentation entities are connected to design logic within a simulation model in the presence of reference(s) to one or more higher level possibly unavailable signal(s) or instrumentation event(s)
Figure 10B:
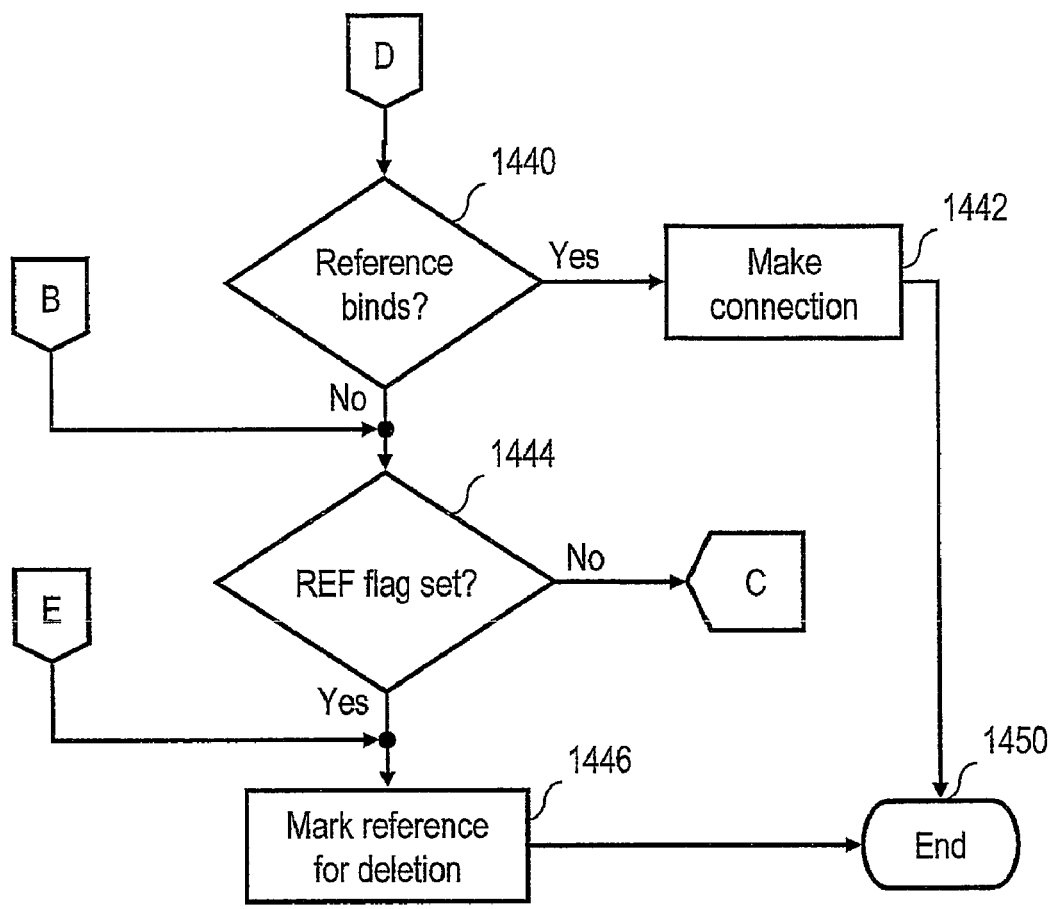

With reference now to FIGS. 10A-10B, there is illustrated a high level logical flowchart of an exemplary process by which random instrumentation logic and/or instrumentation entities are connected to design logic within a simulation model in the presence of reference(s) to one or more higher level and possibly unavailable signal(s) or instrumentation event(s). The illustrated process may be performed, for example, by instrumentation load tool 464 during the model build process of FIG. 3D for each statement including either a signal reference or an instrumentation event reference. In the following description, the exemplary syntax described above is assumed.

The process of FIG. 10A begins at block 1400 and then proceeds to block 1402, which illustrates instrumentation load tool 464 determining, while parsing a statement including either a signal reference or an instrumentation event reference, whether a next term in the statement includes a "#" character indicating that the reference to an instrumentation event or signal name can fail to resolve without an error. If not, the process proceeds directly to block 1406. If so, instrumentation load tool 464 sets a REF flag to signify that a failure to resolve a signal or instrumentation event reference should not be treated as error, as shown at block 1404, and then proceeds to block 1406. At block 1406, instrumentation load tool 464 determines whether it has reached the final signal name or eventname in the reference. If so, the process proceeds through page connector D to block 1440, which is described below. If, however, instrumentation load tool 464 determines that it has not reached the final signal name or eventname in the reference, the process passes to block 1408.

Block 1408 illustrates instrumentation load tool 464 determining whether the portion of the signal or event reference under consideration contains a "move up" character (e.g., a "!") indicating a move upward in the design hierarchy. If not, the process proceeds to block 1420, which is described below. If, however, the portion of the signal or event reference contains a "move up" character, instrumentation load tool 464 determines whether or not moving up one level in the design hierarchy would move beyond the top level of the design hierarchy defined by design entity proto data structures 463, 465, and 467 (block 1410). If so, the process passes through page connector E to block 1446 of FIG. 10B, which is described below. If, however, instrumentation load tool 464 makes a negative determination at block 1410, instrumentation load tool 1412 moves the current scope up one level in the design hierarchy (block 1412). The process then passes through page connector A to block 1401, which depicts instrumentation load tool 464 moving to the next portion of the signal or instrumentation event reference (i.e., the portion following the next "."). The process thereafter returns to block 1406, which has been described.

Referring now to block 1420, in response to a determination that the portion of the signal or event reference under consideration does not contain a "move up" character (e.g., a "!"), instrumentation load tool 464 determines whether or not the design entity referenced by the portion of the signal or event reference exists in the current simulation model. If not, the process passes to block 1430, which is described below. If, however, instrumentation load tool 464 determines that the referenced design entity exists in the simulation model, instrumentation load tool 464 determines at block 1422 whether the entity has been altered by an HDL configuration. If so, instrumentation load tool 464 sets an ALTER flag at block 1424. From block 1424 or in response to a negative determination at block 1422, instrumentation load tool 464 moves the current scope to the indicated design entity (block 1426). The process then passes through page connector A, and processing continues at block 1401 and following blocks.

Referring now to block 1430, if the referenced design entity does not exist in the current simulation model, instrumentation load tool 464 determines whether the ALTER flag has been set for the reference under consideration. If so, the failure to resolve or bind to the referenced design entity does not necessarily represent an error condition, and the process passes through page connector B to block 1444 of FIG. 10B, which is described below Otherwise, instrumentation load tool 464 flags the reference to the instrumentation event or signal name as an error (block 1432) and terminates processing of the statement at block 1434.

Referring now to block 1440 of FIG. 10B, instrumentation load tool 464 determines whether or not the signal name or instrumentation eventname referenced by the statement exists within the current scope. If so, instrumentation load tool 464 logically connects the specified instrumentation logic to the signal or instrumentation event referenced by the statement (block 1442). Thereafter, processing of the statement by instrumentation load tool 464 ends at block 1450. If, however, instrumentation load tool 464 determines at block 1440 that the instrumentation event or signal does not bind (i.e., is not present), instrumentation load tool 464 determines at block 1444 if the REF flag is set. If not, an error condition has occurred, and the process passes through page connector C to blocks 1432 and 1434 of FIG. 10A, which have been described. If, however, instrumentation load tool 464 determines that the REF flag is set, meaning that a failure to bind is not an error for this reference, the process passes to block 1446. Block 1446 depicts instrumentation load tool 446 marking the reference for deletion (as described further below with reference to FIG. 12). Following block 1446, the process terminates at block 1450.

As noted above, instrumentation load tool 464 repeats the process of FIGS. 10A-10B for each reference to a signal or instrumentation event in an instrumentation statement. When all such instrumentation statements have been processed, instrumentation logic is connected in accordance with all references that resolved, and zero or more sourceless references that did not bind remain marked for deletion.

To appropriately handle the sourceless references that did not bind, instrumentation logic 464 deletes all the instrumentation logic from the simulation model that depends in any way on a reference that did not bind. To accomplish this, instrumentation load tool 464 starts at the unbound reference and determines the cone of influence for the reference, that is, all the gates the unbound reference was an input to, the set of gates that reference the outputs of those gates, and so on.

Figure 11:
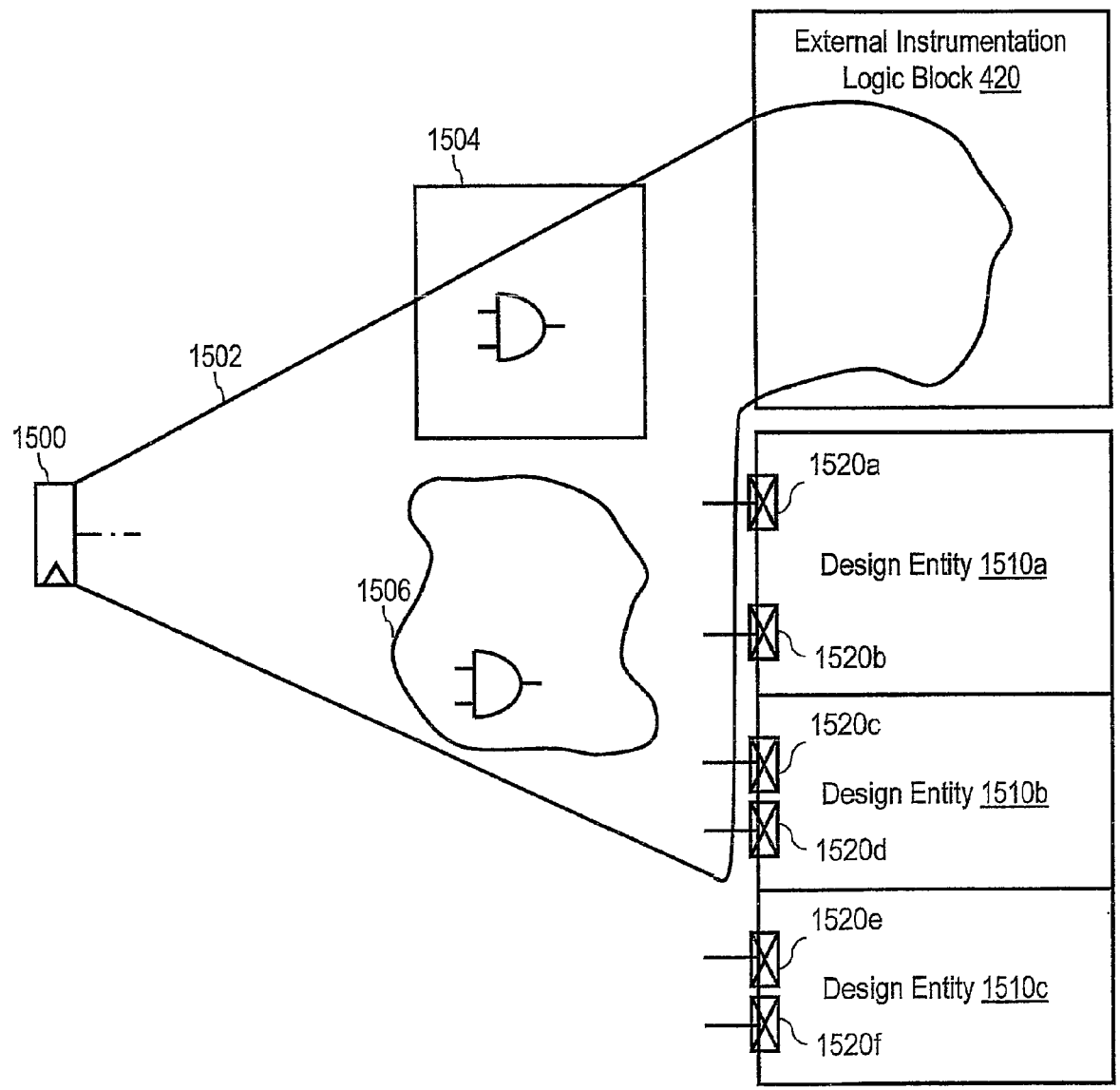
FIG. 11 depicts the cone of influence of a unbound reference in a simulation model under compilation.

Referring now to FIG. 11, there is depicted a block diagram of a portion of an exemplary simulation model during a model build process, which shows the cone of influence of a sourceless reference. In the depicted exemplary simulation model, latch 1500 represents the connection point of instrumentation logic specified for the simulation model that did not bind to a signal or instrumentation event in the simulation model. As shown, the cone of influence 1502 of latch 1500 includes instrumentation logic, which may be found in one or more instrumentation entities 1504 and/or random instrumentation logic 1506 instantiated within one or more design entities.

The cone of influence 1502 of latch 1500 terminates either at external instrumentation logic block 420 of FIG. 4 or at design logic in one or more design entities 150a-1510c of the simulation model. An unbound signal reference can have a cone of influence extending to design entities 1510, for example, if an override event as described above with reference to FIGS. 9A-9C depends on the unbound reference.

Figure 12:
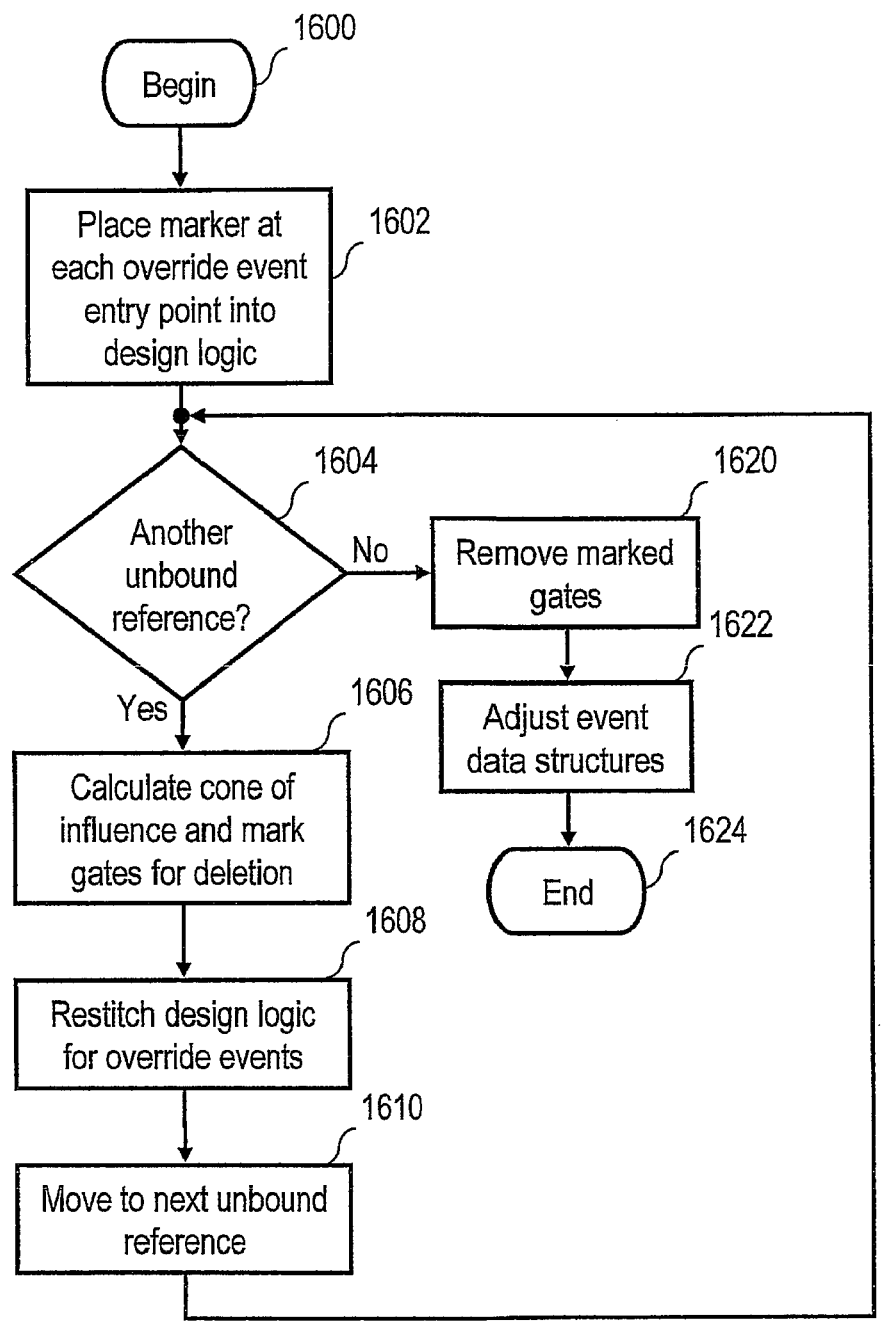
FIG. 12 is a high level logical flowchart of an exemplary process for removing from a simulation model instrumentation logic that depends on unbound signal references.

With reference now to FIG. 12, there is illustrated a high level logical flowchart of an exemplary process for removing instrumentation logic for an unbound reference from a simulation model in accordance with one embodiment. The illustrated process can be performed, for example, by instrumentation load tool 464 following the process shown in FIGS. 10A-10B and during the exemplary model build process depicted in FIG. 3D.

The process shown in FIG. 12 begins at block 1600 and then proceeds to block 1602, which illustrates instrumentation load tool 464 placing a marker at each connection point between an override event and a design entity. Such markers demark the extent of the cones of influence of unbound references, prevent removal of any design logic when instrumentation logic is subsequently removed, and identify locations in the simulation model where the original logic must be reconnected if the instrumentation logic associated with an override event is removed. For example, in FIG. 11, instrumentation load tool 464 places markers 1520a and 1520b at the entry points of override event(s) into design entity 1510a, places markers 1520c and 1520d at the entry points of override events into design entity 1510b, and places markers 1520e and 1520f at the entry points of override events into design entity 1510c. It should be noted that no such markers are placed at the boundary of external instrumentation logic block 420 because it is desirable for unnecessary logic associated with unbound references to be removed from external instrumentation logic block 420.

Next, at block 1604, instrumentation load tool 464 enters a processing loop in which each unbound reference is processed. Thus, if instrumentation load tool 464 determines at block 1604 that all unbound references have been processed, the process proceeds to block 1620, which is described below. If, however, at least one unbound reference remains to be processed, the process proceeds to block 1606, which illustrates instrumentation load tool 464 calculating the cone of influence of the next unbound reference to be processed. As noted above, instrumentation load tool 464 calculates the cone of influence by determining and marking the set of gates and/or latches receiving the unbound reference as an input and any gate or latch having an input coupled directly or indirectly to the output of a gate or latch in the set of gates or latches. As noted above, the cone of influence is prevented from extending into a design entity 1510 by the markers placed at block 1602.

At block 1608, instrumentation load tool 464 re-attaches the design logic to bypass any override instrumentation logic marked for deletion. Instrumentation load tool 464 then moves to the next unbound reference to processed, if any, at block 1610. The process then returns to block 1604 and continues iteratively until all unbound references are processed. The process then proceeds from block 1604 to block 1620, which depicts instrumentation load tool 464 removing from the simulation model all gates that are marked for deletion. Instrumentation load tool 464 then adjusts the event data structures (varlists, for example) based on all the events that were removed from the simulation model (block 1622). The process then terminates at block 1624.

As has been described, the present invention provides an improved data processing system and method of processing. According to the method, an instrumented simulation executable model of a design to be simulated is built from one or more HDL files that specify a plurality of hierarchically arranged design entities defining the design and that specify an instrumentation entity for monitoring simulated operation of the design. Building the model includes compiling the HDL file(s) specifying the plurality of hierarchically arranged design entities defining the design and instantiating at least one instance of each of the plurality of hierarchically arranged design entities, and further includes instantiating an instance of the instrumentation entity within an instance of a particular design entity among the plurality of design entities and, based upon a reference in an instrumentation statement in the one or more HDL files, logically attaching an input of the instance of the instrumentation entity to an input source within the design that is outside the scope of the particular design entity. The construction of the instrumented simulation executable model proceeds even in the presence of one or more references that fail to bind, as any instrumentation that depends upon an unbound reference is automatically removed from the simulation executable model.

While the invention has been particularly shown as described with reference to a preferred embodiment, it will be understood by those skilled in the art that various changes in form and detail may be made therein without departing from the spirit and scope of the invention. For example, although exemplary semantics and syntax are disclosed herein, those skilled in the art will appreciate that alternative semantics and syntax, which may exhibit different behaviors when a referenced design entity, signal or instrumentation event is not present in the model, may alternatively be employed. In addition, although aspects of the present invention have been described with respect to a computer system executing program code that directs the functions of the present invention, it should be understood that present invention may alternatively be implemented as a program product for use with a data processing system. Program code defining the functions of the present invention can be delivered to a data processing system via a variety of signal-bearing media, which include, without limitation, non-rewritable storage media (e.g., CD-ROM), rewritable storage media (e.g., a floppy diskette or hard disk drive), and communication media, such as digital and analog networks. It should be understood, therefore, that such signal-bearing media, when carrying or encoding computer readable instructions that direct the functions of the present invention, represent alternative embodiments of the present invention.

What is claimed is:

1. A method of processing in a data processing system, said method comprising:
    receiving one or more hardware description language (HDL) files that specify a plurality of hierarchically arranged design entities defining a design to be simulated and that specify an instrumentation entity for monitoring simulated operation of the design;
    in response to receiving the one or more HDL files, building an instrumented simulation executable model of the design in accordance with the one or more HDL files, said building including:
        compiling the one or more hardware description language (HDL) files specifying the plurality of hierarchically arranged design entities defining the design and instantiating at least one instance of each of the plurality of hierarchically arranged design entities;
        instantiating an instance of the instrumentation entity within an instance of a particular design entity among the plurality of design entities and, based upon a reference in a first instrumentation statement in the one or more HDL files, logically attaching an input of the instance of the instrumentation entity to a first input source within the design that is outside the scope of the particular design entity;
        in response to detecting that a second instrumentation statement in the one or more HDL files directs attachment of instrumentation to a second input source not present in the design, removing instrumentation logic in a cone of influence associated with the second input source; and
    storing the instrumented simulation executable model of the design in data storage.

2. The method of claim 1, wherein the first input source is one of a set including an instrumentation event and a functional signal of the design.

3. The method of claim 1, wherein:
    said removing is performed only in response to detection of an indication in the second instrumentation statement that absence of the referenced second input source is not an error.

4. The method of claim 1, and further comprising:
marking a boundary of at least one instance of a design entity to prevent removal of logic from the at least one instance of the design entity by said removing.

5. The method of claim 1, wherein
the second input source is within a design entity not present in the design.

6. A program product, comprising:
a computer-readable storage device storing program code that causes a data processing system to perform:
  receiving one or more hardware description language (HDL) files that specify a plurality of hierarchically arranged design entities defining a design to be simulated and that specify an instrumentation entity for monitoring simulated operation of the design;
  in response to receiving the one or more HDL files, building an instrumented simulation executable model of the design in accordance with the one or more HDL files, said building including:
    compiling the one or more hardware description language (HDL) files specifying the plurality of hierarchically arranged design entities defining the design and instantiating at least one instance of each of the plurality of hierarchically arranged design entities;
    instantiating an instance of the instrumentation entity within an instance of a particular design entity among the plurality of design entities and, based upon a reference in an instrumentation statement in the one or more HDL files, logically attaching an input of the instance of the instrumentation entity to a first input source within the design that is outside the scope of the particular design entity;
    in response to detecting that a second instrumentation statement in the one or more HDL files directs attachment of instrumentation to a second input source not present in the design, removing instrumentation logic in a cone of influence associated with the second input source; and
  storing the instrumented simulation executable model of the design in data storage.

7. The program product of claim 6, wherein the first input source is one of a set including an instrumentation event and a functional signal of the design.

8. The program product of claim 6, wherein:
said removing is performed only in response to detection of an indication in the second instrumentation statement that absence of the referenced input source is not an error.

9. The program product of claim 6, wherein the process further includes:
marking a boundary of at least one instance of a design entity to prevent removal of logic from the at least one instance of the design entity by said removing.

10. The program product of claim 6, wherein
the second input source is within a design entity not present in the design.

11. A data processing system, comprising:
a processor; and
data storage coupled to the processor and including program code that when processed by the processor performs a process including:
  receiving one or more hardware description language (HDL) files that specify a plurality of hierarchically arranged design entities defining a design to be simulated and that specify an instrumentation entity for monitoring simulated operation of the design;
  in response to receiving the one or more HDL files, building an instrumented simulation executable model of the design in accordance with the one or more HDL files, said building including:
    compiling the one or more hardware description language (HDL) files specifying the plurality of hierarchically arranged design entities defining the design and instantiating at least one instance of each of the plurality of hierarchically arranged design entities;
    instantiating an instance of the instrumentation entity within an instance of a particular design entity among the plurality of design entities and, based upon a reference in an instrumentation statement in the one or more HDL files, logically attaching an input of the instance of the instrumentation entity to a first input source within the design that is outside the scope of the particular design entity;
    in response to detecting that a second instrumentation statement in the one or more HDL files directs attachment of instrumentation to a second input source not present in the design, removing instrumentation logic in a cone of influence associated with the second input source; and
  storing the instrumented simulation executable model of the design in data storage.

12. The data processing system of claim 11, wherein the first input source is one of a set including an instrumentation event and a functional signal of the design.

13. The data processing system of claim 11, wherein:
said removing is performed only in response to detection of an indication in the second instrumentation statement that absence of the referenced input source is not an error.

14. The data processing system of claim 11, wherein the process further includes:
marking a boundary of at least one instance of a design entity to prevent removal of logic from the at least one instance of the design entity by said removing.

15. The data processing system of claim 11, wherein
the second input source is within a design entity not present in the design.

* * * * *